US005457749A

United States Patent [19]

Cain et al.

[11] Patent Number: 5,457,749

[45] Date of Patent: Oct. 10, 1995

[54] ELECTRONIC MUFFLER

[75] Inventors: John A. Cain, Phoenix; Dennis H. Barnes, Mesa; David A. Dye, Phoenix, all of Ariz.

[73] Assignee: Noise Cancellation Technologies, Inc., Linthicum, Md.

[21] Appl. No.: 172,506

[22] Filed: Dec. 22, 1993

Related U.S. Application Data

[63] Continuation-in-part of Ser. No. 172,563, Dec. 21, 1993, abandoned, which is a continuation-in-part of Ser. No. 879,517, May 4, 1992, Pat. No. 5,272,286, which is a continuation-in-part of Ser. No. 507,366, Apr. 9, 1990, abandoned.

[51] Int. Cl.$^6$ .......... H03B 29/00

[52] U.S. Cl. .......... 381/71; 381/86

[58] Field of Search .......... 381/71, 86, 154; 181/204, 206

[56] References Cited

U.S. PATENT DOCUMENTS

| | | | |
|---|---|---|---|
| 4,527,282 | 7/1985 | Chaplin et al. | 381/71 |
| 5,097,923 | 3/1992 | Ziegler et al. | 181/206 |
| 5,146,505 | 9/1992 | Pfaff et al. | 381/71 |
| 5,216,722 | 6/1993 | Popovich | 381/71 |
| 5,222,148 | 6/1993 | Yuan | 381/71 |
| 5,255,321 | 10/1993 | Murray et al. | 381/71 |
| 5,325,437 | 6/1994 | Doi et al. | 381/71 |
| 5,363,450 | 11/1994 | Moody et al. | 381/71 |
| 5,363,451 | 11/1994 | Martinez et al. | 381/71 |

OTHER PUBLICATIONS

"Anti–noise—the Essex Breakthrough", Prof. Barrie Chaplin Chartered Mechanical Engineer Jan. 1983 p. 41.

*Primary Examiner*—Stephen Brinich
*Attorney, Agent, or Firm*—James W. Hiney

[57] ABSTRACT

An electronic muffling device is disclosed for suppressing the noise emitted by an outlet of an exhaust pipe of an engine. The device comprises a housing having an outlet and a plurality of audio transducers. The transducers supply anti-noise to cancel detected unwanted noise. A microphone appropriately positioned to detect residual noise is coupled to a cancellation signal generator, which controls the anti-noise generated by the transducers. Anti-noise and unwanted engine noise propagate through a front volume within the housing so that exhaust gases are transmitted through the housing, but engine noise is canceled before leaving the housing. Exhaust gas may be transmitted into the housing, or may be passed through the housing without leaving the exhaust pipe. In either embodiment, engine noise enters the front volume and is canceled.

18 Claims, 14 Drawing Sheets

ELECTRONIC MUFFLER

RELATED APPLICATION

This is a continuation-in-part of Ser. No. 08/172,563 filed Dec. 21, 1993, now abandoned, which is a continuation-in-part of Ser. No. 07/879,517 filed May 4, 1992, now U.S. Pat. No. 5,272,286, issued Dec. 21, 1993, which is a continuation-in part of Ser. No. 07/507,366, filed Apr. 9, 1990, now abandoned.

TECHNICAL FIELD

The present invention relates to electronic muffling devices, particularly those of the type used in connection with the exhaust pipes of internal combustion engines.

BACKGROUND

Very early in the evolution of the internal combustion engine, it was discovered that noise emitted by the engine could be reduced by resonant sound muffling devices (muffler). In general, such mufflers comprised acoustic filters, which generally employ interference principles to cancel sound. Typically, the sound waves generated by the engine are broken into two parts. Each part follows a separate path having a different effective length. Ultimately, before leaving the muffler, the waves meet at a point where they are 180° out of phase and are thus cancelled. For example, a quarter wavelength resonant cavity, comprising a chamber closed at one end and open at the other, is known as a Helmholz cavity. Sounds entering the open end of the chamber pass through and are reflected back to the open end of the chamber with a phase delay of one-half of a wave length, i.e., 180°. Such cavities can be created employing a matrix of baffles. Conventional automotive mufflers pass exhaust gases over a matrix of baffles, which together define a plurality of such tuned cavities, to cancel the particular sound frequencies to which the chambers are tuned.

Such acoustic mufflers are disadvantageous in a number of respects. Such mufflers tend to create an undesirable back pressure on the engine, are commonly bulky, require a relatively high degree of maintenance, and are limited in effective frequency range. For example, the effectiveness of conventional resonant sound mufflers is limited for sound frequencies below about 100 Hz; sound occurring below that frequency is not efficiently diminished and propagates to the ambient atmosphere as unwanted noise.

However, electronic mufflers which are capable of diminishing low frequency noise are also known. Electronic mufflers eliminate unwanted engine noise using destructive interference (the principle of superposition). Cancellation is achieved by propagating "anti-noise", an acoustic signal having the same spectral characteristics as the unwanted noise but 180 degrees out of phase. The anti-noise interacts with the unwanted engine noise and results in cancellation. An electronic muffler system typically includes a sound generator (e.g. speaker or speakers) and a controller. The sound generator produces anti-noise in accordance with drive signals from the controller. The controller drives the sound generator according to signals representative of the noise field (exhaust noise) to be canceled.

More specifically, the residual noise (i.e., the noise remaining after superposition) is sensed, typically by a microphone disposed to sense the exhaust noise, and a signal indicative of the residual noise is provided to the controller.

In many systems, a signal indicative of the periodicity of the exhaust noise (e.g. a tachometer signal indicative of engine speed) is also provided to the controller. The controller drives the actuator accordingly. Examples of electronic muffler systems are described in: U.S. Pat. No. 4,527,282, issued Jul. 2, 1985, to Chaplin, et al.; U.S. Pat. No. 5,097, 923, issued Mar. 24, 1992, to Ziegler, et al.; French Patent 1,190,317, issued March, 1959, to Scherrer; G. B. B. Chaplin, *The Cancellation of Repetitive Noise and Vibration,* INTER-NOISE 80, December 8–10, (1980); G. B. B. Chaplin, *Anti-Noise— The Essex Breakthrough,* CHARTERED MECHANICAL ENGINEER, page 41 (Jan. 1983); and I. Brown, *The Application of Simple Source Theory to Active Noise Control,* PROCEEDINGS OF THE INSTITUTE OF ACOUSTICS (1985).

SUMMARY OF THE INVENTION

A noise cancellation system according to various aspects of the present invention comprises a housing having an exhaust pipe or assembly running therethrough. The volume between the inner surface of the housing and the exhaust pipe is divided into a front volume and two symmetrical rear volumes by two mirror image interior baffles mounted in the housing. The front volume of the housing includes an inlet port and an outlet port for respective entry and exit of the exhaust or exhaust assembly.

The muffler further comprises two speakers mounted on each baffle, the speakers having a front surface and a rear surface. The front surface of each speaker is directed towards the front volume and the rear surface of each speaker is directed towards the corresponding rear volume. The front and the respective rear volumes are acoustically coupled through the speakers. In addition, the front surfaces of the speakers do not face each other directly.

Further, the two rear volumes are acoustically coupled to each other by way of a hollow channel. The hollow channel connecting the two rear volumes augments the performance of the muffler by equalizing any size or pressure differences between the respective rear volumes.

Gases and noise are transported through the muffler by an exhaust assembly duct connected to the exhaust pipe. The duct may include a series of louvers or perforations to allow engine noise to escape into the front chamber of the muffler, which is not open to the exterior of the muffler, where the engine noise mixes with anti-noise from the speakers and is canceled. Exhaust gases and heat, on the other hand, are transported away from the front volume. Protective barriers shield the speakers to protect them from heat dissipated from the exhaust. A protective sleeve or a steel wool wrap may be placed between the louvers or perforations and the speakers to provide further thermal insulation. Alternatively, the exhaust duct may terminate within the front volume of the muffler to take advantage of various acoustic characteristics of the front volume, such as potentially improved attenuation.

In another embodiment of a muffler according to the present invention, multiple chambers are each driven by one or more mechanical actuators. The mechanical actuators associated with any one chamber generate anti-noise within a particular frequency range. In a preferred version of this embodiment, a muffler system includes two acoustic cancellation chambers. The mechanical actuators that project sound into the first acoustic cancellation chamber generate anti-noise in a low frequency range; the mechanical actuators associated with the second chamber generate an acoustic cancellation signal within a higher frequency range. This adaptation provides for independent cancellation within multiple specific frequency ranges for optimal— cancellation.

BRIEF DESCRIPTION OF THE DRAWING

The preferred exemplary embodiment of the present invention will hereinafter be described in conjunction with the appended drawing, wherein like designations denote like elements, and.

DESCRIPTION OF A PREFERRED EXEMPLARY EMBODIMENT

Figure 1:
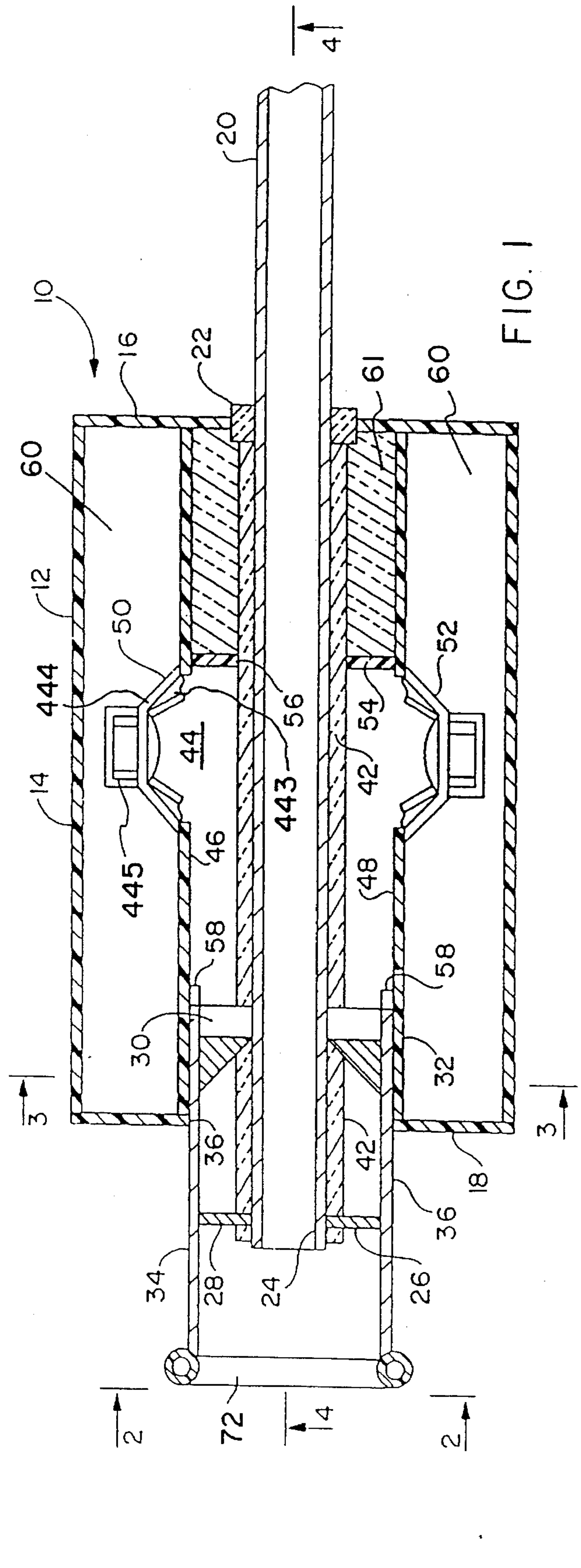
FIG. 1 is a top plan view in cross section of a first embodiment an engine muffler constructed in accordance with various aspects of the present invention.

Referring to FIGS. 1–4, a muffler 10 in accordance with various aspects of the present invention comprises an outer casing 12, an exhaust pipe 20, a chamber pipe 34, a heat insulating material 42, an acoustical chamber 44, actuators 50, 52, rear cavities 60, volume adjustment chambers 61, 64 and 66, and a tubular microphone assembly 72.

Outer casing 12 comprises a cylindrical member 14, a forward end cap 16 and a rear end cap 18. Cylindrical member 14, forward end cap 16 and rear end cap 18 are suitably made of a relatively inexpensive material, such as plastic, which is selected for mechanical strength and durability over a wide range of temperatures and other environmental extremes as experienced by an automobile muffler.

Exhaust pipe 20 may comprise the end of a conventional exhaust pipe, or may comprise a separate extension attached to the end of a conventional exhaust pipe. Exhaust pipe 20 is suitably made of steel, stainless steel or any other suitable material having a thickness sufficient to maintain mechanical integrity, and is preferably durable enough to withstand corrosion and environmental extremes for the life of the automobile without diminishing performance. When installed, muffler 10 and exhaust pipe 20 are secured to the underside of the automobile. Exhaust pipe 20 is connected at one end to the exhaust of the engine (e.g., if a separate extension, through a conventional exhaust pipe).

Exhaust pipe 20 is mounted within casing 12 and supported in forward end cap 16 by an insulative annular member 22. The other end 24 of exhaust pipe 20 is secured to chamber pipe 34 by a plurality of radial support members 26, 28, 30 and 32. Radial support members 26–32 are suitably attached to exhaust pipe 20 and chamber pipe 34 by welding or by other suitable mechanisms. Chamber pipe 34 and support members 26–32 are preferably all made of steel, stainless steel, plastic or other suitable materials of sufficient strength and durability.

Figure 4:
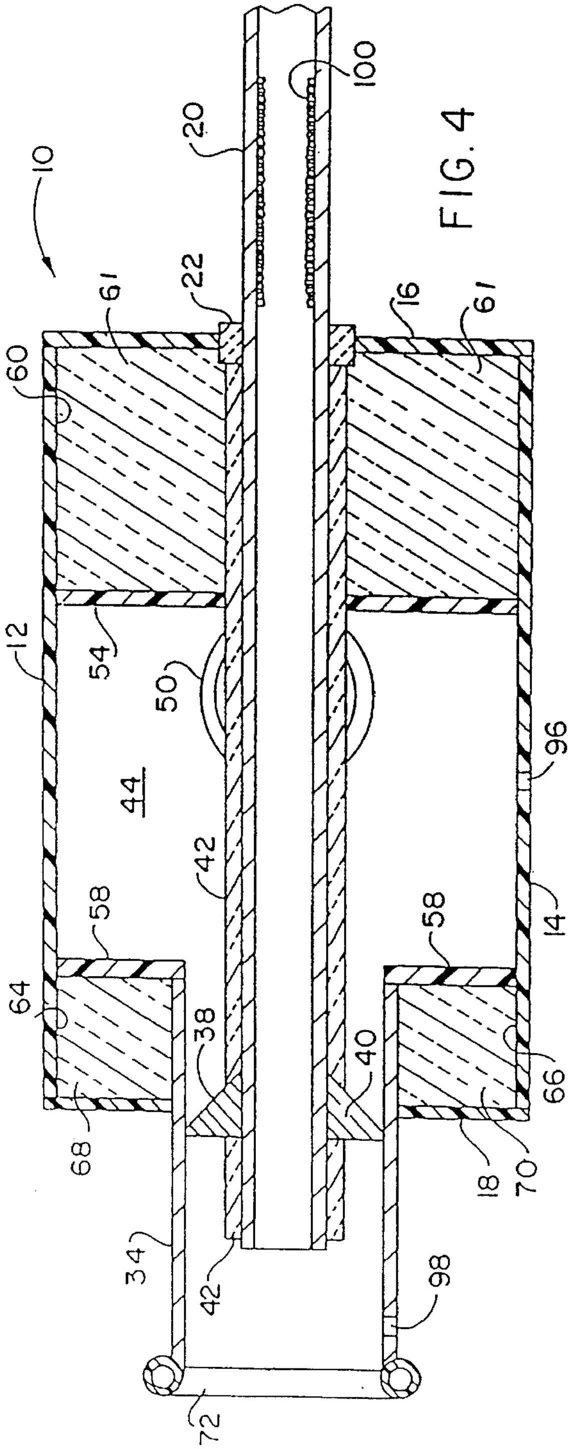
FIG. 4 is a view along lines 4—4 of FIG. 1 showing a side view in cross section.

Chamber pipe 34 is securely mounted within rear end cap 18, e.g. by being securely attached or jam-fitted in a circular hole 36 within rear end cap 18. Additional support may be provided by a pair of transverse radial support members 38 and 40 (FIG. 4). Transverse radial support members 38, 40 are suitably made of material similar to that of support members 26–32. Transverse radial support members 38 and 40 and radial support members 30 and 32 preferably comprise triangular pieces of relatively thick sheet metal to provide support when forces are applied to the muffler structure in the direction parallel to the axis of symmetry of exhaust pipe 20, i.e. longitudinal forces.

Heat within exhaust pipe 20 is isolated from the remainder of the system by a cylindrical layer of heat insulative material 42 disposed around exhaust pipe 20. Typically, this material comprises insulating fiberglass wrap, header wrap, or an isolating air cavity.

Actuators 50 and 52 suitably comprise conventional speakers including a driver (magnet) 449 and diaphragm (cone) with a front surface 443 and rear surface 444. Speakers 50 and 52 are, however, preferably ruggedized through e.g., use of waterproof materials such as Kevlar, or impregnated materials, with a neoprene muffler surround, or through the application of a protective coating of Kevlar. An acceptable degree of performance has been achieved using circular thirteen centimeter thirty watt speakers of the type manufactured by AUDAX under Catalog No. HIF13JVX, suitably with a protective coating of Kevlar.

Actuators 50 and 52 are preferably disposed within casing 12 on respective inner planar walls 46 and 48. A forward wall 54, including a central hole 56 through which exhaust pipe 20 and insulative material 42 are disposed, is positioned between planar walls 46 and 48. A rear wall 58 is disposed parallel to rear end cap 18, longitudinally offset from rear end cap 18 by the distance that chamber pipe 34 extends interiorly beyond end cap 18, i.e. rear wall 58 is positioned at the inside end of chamber pipe 34. Rear wall 58 and forward wall 54 are suitably both made of material similar to that of outer casing 12.

Chamber pipe 34, inner planar walls 46 and 48, actuators 50 and 52, rear wall 58, and forward wall 54 define acoustical chamber 44. Forward wall 54, forward end cap 16, inner planar walls 46, 48, and pipe 20 also form forward cavities 60. Similarly, forward wall 54, forward end cap 16, inner planar walls 46, 48, and pipe 20 form volume adjustment cavity 61. Likewise, rear wall member 58 defines volume adjustment chambers 64 and 66 (FIG. 4). Volume adjustment chambers 61, 64, and 66 are suitably filled with sound absorbing material, such as fiberglass, generally indicated as 62, 68 and 70, to adjust the equivalent cavity volume and improve and simplify the acoustical properties of acoustical chamber 44, preventing random oscillations and resonances from interfering with the operation of the muffler.

Tubular microphone assembly 72 is disposed at the end of chamber pipe 34. Referring to FIGS. 1–6, microphone assembly 72 suitably comprises a circular tubular member 78 defining an annular cavity 84, and includes a plurality of holes 76 and a predetermined number (e.g. 4) of microphones 80 disposed within annular cavity 84. Generally, holes 76 are equally spaced along the circumference of member 78. One such hole 76 is illustrated in detail in FIG. 5. Preferably, microphones 80 are also equispaced within the circumference of member 78. Microphone assembly 72 is preferably secured to the end of chamber pipe 34. Any suitable mechanism, such as, e.g., rivets, adhesive, or the like may be employed. The electrical outputs of the multiple microphones are combined (e.g. averaged) using a mixing circuit to provide a composite residual error signal.

Figure 6:
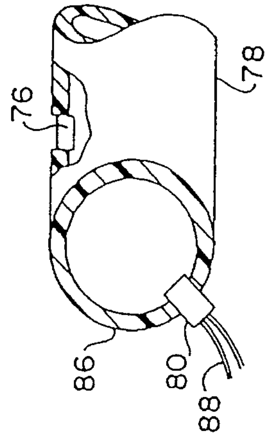
FIG. 6 is a cross-sectional view along lines 6—6 of FIG. 2 illustrating the placement of a microphone within the microphone assembly.
Figure 5:
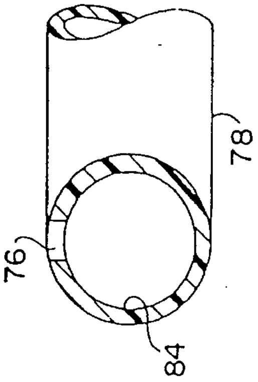
FIG. 5 is a detail along lines 5—5 of FIG. 2 illustrating the construction of a microphone assembly useful in conjunction with the muffler of FIG. 1.
Figure 3:
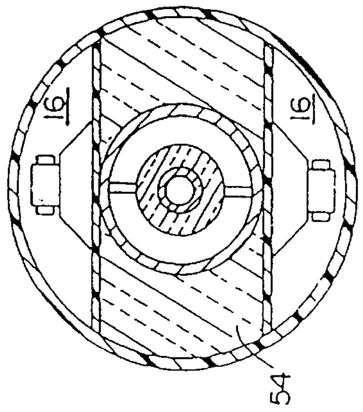
FIG. 3 is a view along lines 3—3 of FIG. 1 showing the construction of the muffler in cross section.
Figure 2:
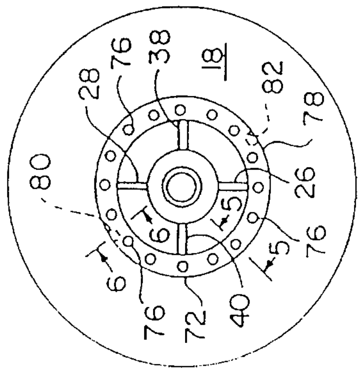
FIG. 2 is a view along lines 2—2 of FIG. 1.

As illustrated by the enlarged detailed diagram of FIG. 6, microphones 80 may be embedded in a sidewall 86 of circular tubular member 78. Microphones 80 may be positioned at a variety of angular positions depending upon the selected route of a microphone cable 88 on the inside or outside of the device.

Tubular ring microphone assembly 72 is durable and has excellent performance characteristics. Microphones 80 are protected from the environment, particularly weather and heat, by being positioned within circular tubular member 78. In addition, the use of numerous holes 76 in circular tubular member 78 results in numerous individual inputs to the microphones and results in acoustically average random noise, thus drastically reducing wind and exhaust turbulence effects. The tubular configuration with the multiple microphones produces a residual error signal which is the integrated-averaged error as measured along the perimeter of the ring. For a dynamic muffler, measuring the error at the zone of cancellation produces a desirable symmetrical cancellation zone.

Tubular member 78 is suitably constructed from an insulating tubular material, such as plastic tube. This creates a thermally insulating medium to protect the microphone from exhaust gases. The size and number of holes can be varied to adjust the amount of sound pickup. The plastic tube member 78 of the microphone assembly protects the microphones by surrounding them with captive, thermally insulating air. The use of open holes at the exhaust outlet provides an accurate means of sound transmission without directly exposing the microphone elements to corrosive, hot exhaust gases. The tubular material is perforated at regular intervals, corresponding to 30–50 holes per wavelength at the highest frequency of interest (i.e., 0.44 meters wavelength corresponding to 600 Hz). The size of holes 76 is preferably small, typically around 0.0062 meters.

Figure 5A:
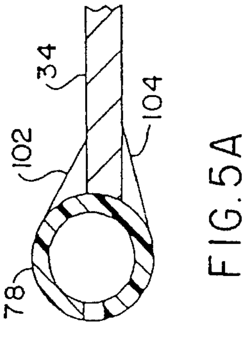
FIG. 5A is a detailed cross-section of the microphone assembly having aerodynamic surfaces.

An alternative configuration is to cover the perforations in the tubular member with thin (0.001") Kapton™ tape. This provides all of the above noted advantages of the tubular microphone while providing a sealed configuration. A variety of profiles may be used in order to minimize turbulence about holes 76. For example, if desired, aerodynamic surfaces 102 and 104 may be used to reduce turbulence, as illustrated in FIG. 5A.

Figure 7:
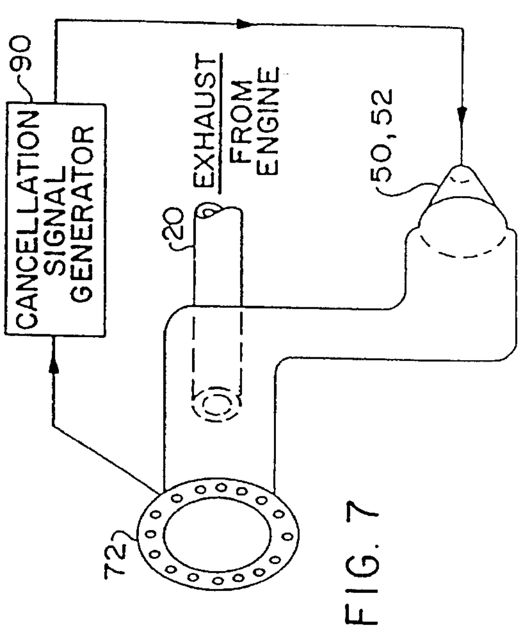
FIG. 7 is a block diagram of the inventive system.

Referring to FIG. 7, a noise cancellation system 600 comprises a muffler 10A, including microphone assembly 72, and actuators 50, 52 and a conventional cancellation signal generator (controller) 90. The noise generated by exhaust pipe 20 and actuators 50, 52 is detected by tubular microphone assembly 72. Microphone assembly 72 transmits an error signal to cancellation signal generator 90. Cancellation signal generator 90, in turn, generates a cancellation signal to drive actuators 50 and 52. Cancellation signal generator 90 may be any controller suitable for providing anti-noise drive signals to actuators 50 and 52.

Good cancellation results for typical automotive sound pressure levels may be achieved supplying 20 to 50 watts of electrical power to actuators 50, 52. In principle, while a single speaker functions, providing two or more speakers contributes advantageous redundancy, allows use of a smaller enclosure, and improves the symmetry of the system.

Generally, cancellation is required in the range below 800 hertz. If it is desired to achieve complementary cancellation in the range above 800 hertz, a thin steel wool liner or other suitable liner may be positioned within exhaust pipe 20. Other traditional passive muffler attenuation methods may be integrated into the dynamic muffler for high frequency attenuation.

In engines having opposing cylinder bank configurations, e.g. V-8 or V-6 engines, the exhaust from the opposing cylinder banks is generally directed to separate exhaust manifolds. If the opposing banks of cylinders also fire in an alternating pattern, providing each manifold with its own muffling system halves the range of frequencies to be canceled. Thus, an 800 hertz combined frequency becomes a 400 hertz frequency when the manifolds are treated individually.

The acoustic properties of exhaust emissions varies, depending upon the structural and operating characteristics of the particular engine. Some combustion engines produce noise harmonics predominantly in a low-frequency range, i.e., 20–200 Hz, while others generate strong harmonics in higher frequency ranges (e.g., 200 Hz–500 or 600 Hz), while still others generate harmonics in both frequency ranges. A combustion engine producing noise having strong harmonics in both the low and high frequency ranges can be accommodated by a muffler which, according to another aspect of the present invention, includes a plurality of acoustically tuned chambers.

Figure 12:
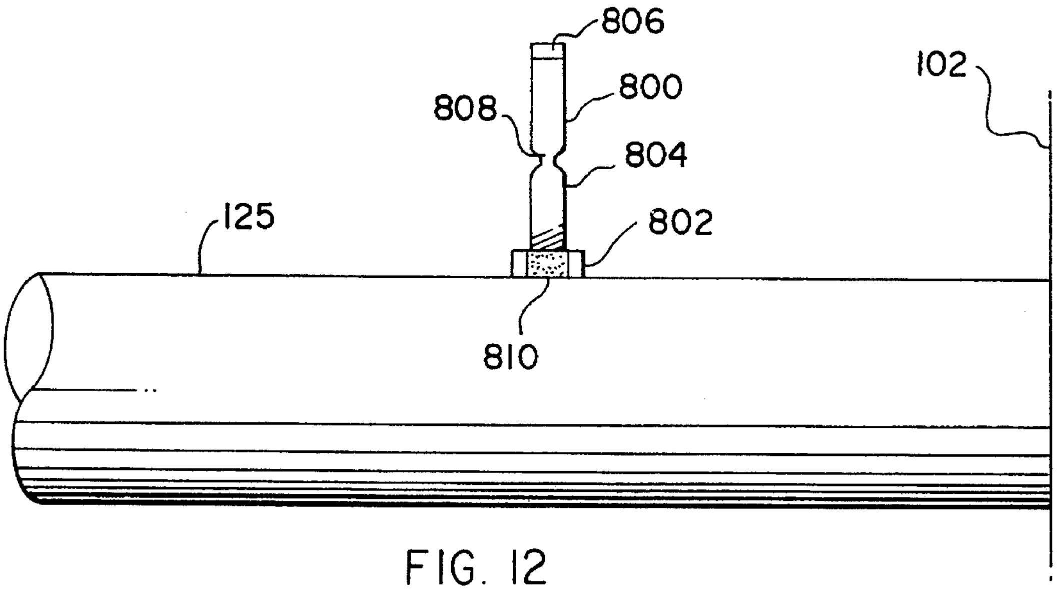
FIG. 12 is a side view of an exhaust pipe having a sensor assembly mounted thereon.
Figure 13:
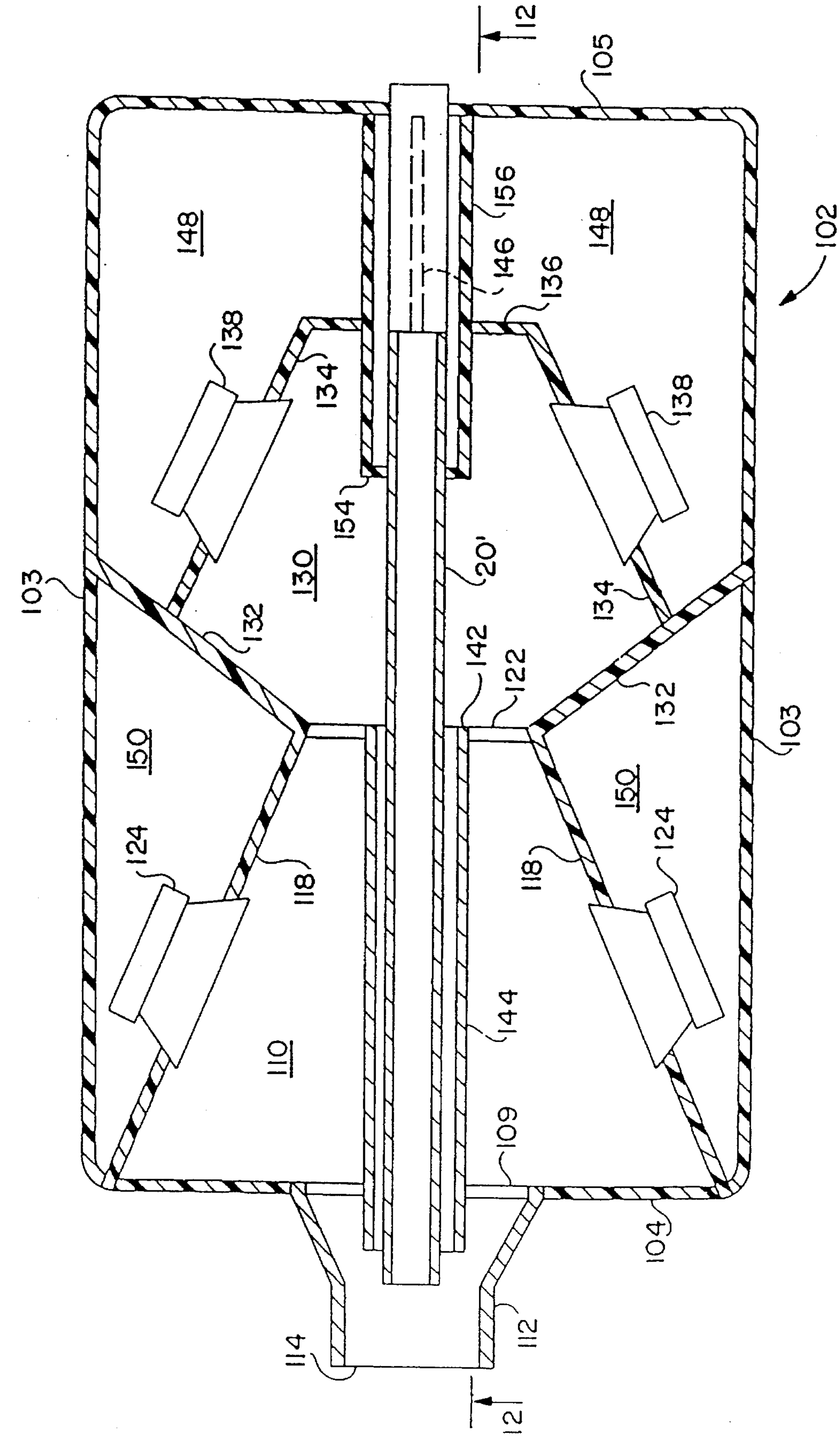
FIG. 13 is a plan view in cross section of an engine muffler constructed in accordance with another embodiment of the present invention, illustrating a muffler configuration having multiple cancellation chambers.
Figure 14:
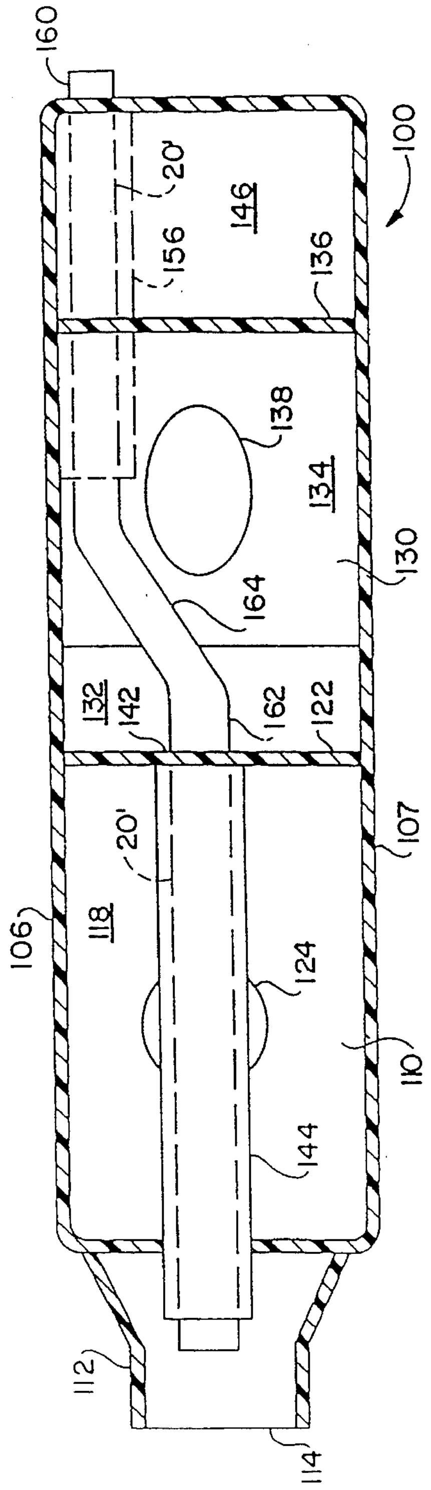
FIG. 14 is a side view in cross section of the muffler of FIG. 11.

Referring now to FIGS. 13 and 14, a multiple chamber muffler 100 according to the present invention comprises an outer casing 102, comprising side walls 103A, 103B, rear wall 104, front wall 105, top wall 106 (FIG. 12), and bottom wall 107 (FIG. 12); baffles 118, 134; a high frequency acoustic chamber 110; a low-frequency acoustic chamber 130; a plurality of back chambers 148, 150; and a plurality of actuators, suitably speakers 124, 138.

Outer casing 102 is preferably formed of an inexpensive material or plastic capable of withstanding high temperatures and severe weather conditions. Outer casing 102 is suitably generally rectangular. In the preferred embodiment, outer casing 102 is approximately 19.75 inches long, 13.75 inches wide, and 7.25 inches high. An aperture 109 is formed in the rear wall 104 so that the end of an exhaust duct 125 protrudes through aperture 109 outside of casing 102 and into a mixing chamber 112. Aperture 109 is significantly larger than the outside diameter of exhaust duct 125, so high-frequency acoustic cancellation chamber 110 communicates with mixing chamber 112. In the preferred embodiment, mixing chamber 112, constructed of a non-corrosive metallic material, is 6 inches long, about 6 inches in diameter at the flared portion proximate the back-wall 104, and approximately 5 inches in diameter at its terminus 114. The terminus of the exhaust duct 125 is located approximately midway into mixing chamber 112, while the terminus of the elongate port 144 is about 1 inch farther from the rear. For reasons of clarity, the microphone used to develop the error signal, such as the tubular microphone assembly of FIGS. 1–2 and 4–7, is not shown in FIGS. 13 and 12.

The interior of casing 102 is divided into high-frequency acoustic chamber 110, low-frequency acoustic chamber 130, and respective back volumes 150, 148. A pair of baffles 118 and a front cross-wall 122 define high-frequency acoustic chamber 110, which, in the preferred embodiment, encloses a volume of approximately 1.5 liters. Baffles 118 and front cross-wall 122 are oriented to extend between the top and bottom walls 106, 107 of the outer casing 102, and are generally perpendicular thereto. Baffles 118 are angularly oriented so that speakers 124 do not directly face each other, preventing standing waves within the high-frequency acoustic chamber 110.

Similarly, front cross-wall 122, divider walls 132, rear cross-wall 136, and baffles 134 define a low-frequency acoustic chamber 130, which has a volume of 3.42 liters in the preferred embodiment. Like baffles 118 and front cross-wall 122, divider walls 132, baffles 134, and rear cross-wall 136 extend between the top and bottom walls 106, 107 of enclosure 102 and are generally perpendicular thereto, and baffles 134 are similarly angularly oriented.

An aperture 142 is formed in front cross-wall 122, in which one end of an elongate port 144 is mounted. Elongate port 144 is suitably 4 inches in diameter and 8.5 inches long, and is constructed of a non-corrosive, metallic material. Elongate port 144 preferably extends from cross-wall 122 to terminate near aperture 109. Elongate port 144, which may be force fitted in the aperture 142, communicates low frequency anti-noise from the low-frequency acoustic cancellation chamber 130 to mixing chamber 112.

A pair of high-frequency mechanical actuators, suitably speakers 124, are mounted on baffles 118, with the front surface of each speaker cone exposed to high-frequency acoustic chamber 110. High-frequency mechanical actuators 124 receive high-frequency control signals from cancellation signal generator 190, discussed below with respect to FIG. 15, and produce anti-noise in accordance with the control signals. Preferably, high-frequency mechanical actuators 124 have a frequency response in the range of 200 Hz to 500–600 Hz, such as Polydax TX100 8-ohm, 7-inch speakers (part no. PR17 TX 100 1AK7), manufactured by Polydax Speaker Corporation of 10 Upton Drive, Wilmington, Mass.

Similarly, a low frequency mechanical actuator 138, structured to operate predominantly in the frequency range of approximately 20 Hz to about 200 Hz, is mounted on each baffle 134. Low-frequency actuators 138 receive low-frequency cancellation signals from cancellation signal generator 190. Low frequency speakers manufactured by M&M Electronics of 338 North Canal Street, South San Francisco, Calif. (Model: Godfather 6–4) are suitable mechanical actuators 138.

Extending from the cross-wall 136 to the front wall 105 of the outer casing 102 is a divider wall 146 which, together with rear cross-wall 136, baffles 134, and divider walls 132, forms a pair of back volumes 148 for low frequency actuators 138. Baffles 118 and divider walls 132 form, with sidewalls 103 of the outer casing 102 (as well as top and bottom walls 106, 107, respectively), back volumes 150 for high-frequency actuators 124. Preferably, back volumes 148, 150 are sealed to enclose a volume of air to form a spring-like cushion for the mechanical actuators 124, 138. Thus, the mechanical actuators 124, 138 and associated back volumes 148, 150 operate as what is commonly known as acoustic suspension speakers. As described below, each back volume 148, 150 may be connected to its counterpart through a hollow channel, which equalizes the volume and pressure between each pair of volumes. In the preferred embodiment, back volumes 150 associated with high frequency mechanical actuators 124 each enclose a volume of approximately 1.75 liters. Back volumes 148 associated with low frequency mechanical actuators 138 enclose approximately 5 liters.

Exhaust extension duct 125 enters muffler 100 through an aperture plate 154 and passes through low-frequency acoustic cancellation chamber 130. In the preferred embodiment, exhaust duct 125 is approximately 2 inches in diameter. Aperture plate 154 suitably comprises a generally U-shaped channel 156 formed in top wall 106 of casing 102 above divider 146. As illustrated in FIG. 14, exhaust extension duct 125 is formed and configured to have a forward section 160 that is joined to a rear section 162 by a bend 164.

Forward section 160 of exhaust extension duct 125 is located outside of muffler 100, and secured within U-shaped channel 156 by any appropriate attachment apparatus such as, for example, welding. Exhaust duct sections 160, 162 and 164 may be wrapped in an appropriate insulative material to protect the parts of the muffler 100 that are proximate exhaust duct 125. In addition, the portions of exhaust duct 125 that travel through cross-walls 122, 136 may be mounted therein by radial support members in a same manner that radial support members 26, 28, 30 and 32 mount exhaust duct 20 in muffler 10 (FIG. 1).

Figure 15:
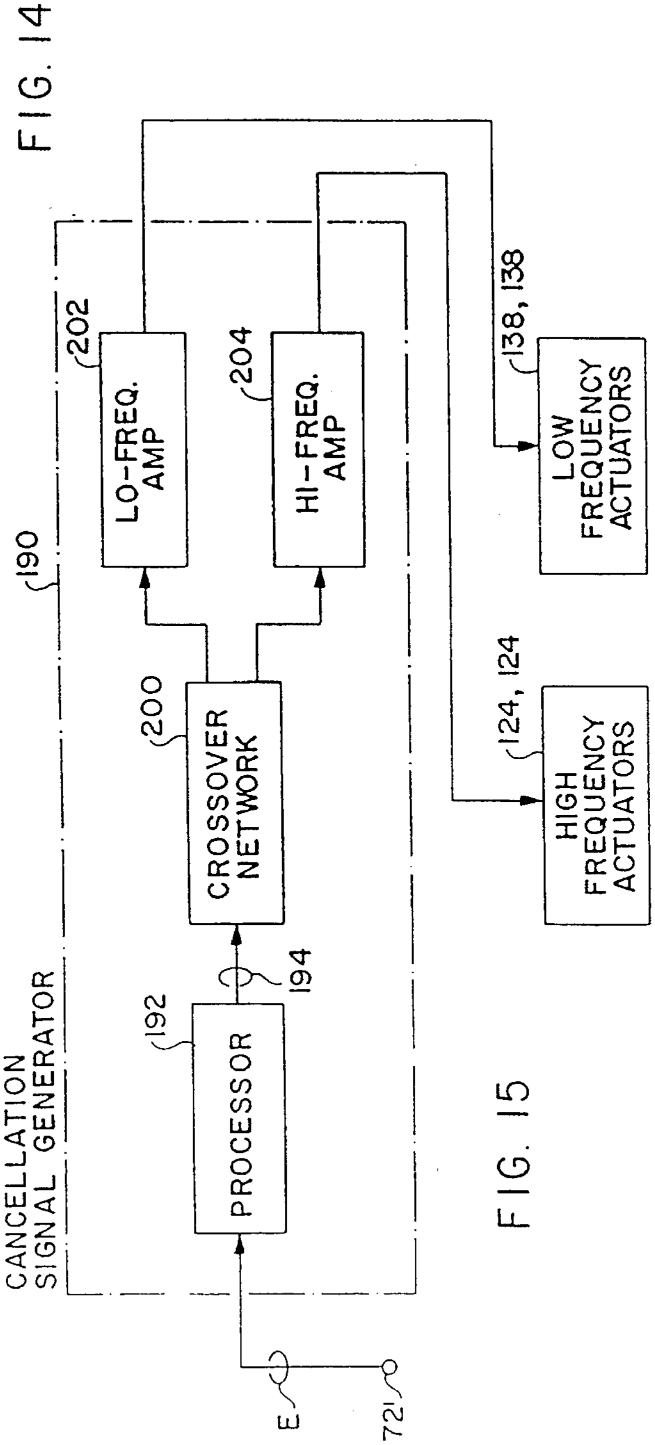
FIG. 15 is a simplified block diagram of the embodiment of FIGS. 13 and 14.

Muffler 100 operates in a generally similar manner as muffler 10 (FIGS. 1–7). Referring now to FIG. 15, cancellation signal generator 190, however, includes a digital signal processor 192 that receives an error signal (E) developed by a sensor, e.g., sensor assembly 72. Digital signal processor 192 develops therefrom, and suitably from a synchronization signal (not shown), in known fashion, a frequency cancellation signal. The frequency cancellation is provided, via signal channel 194, to a suitable crossover network 200 which divides the received cancellation signal into a high cancellation signal and a low cancellation signal. Alternatively, processor 192 may directly develop the appropriate cancellation signals in the relevant frequency ranges. The two cancellation signals are then coupled from crossover network 200 to drive appropriate high and low frequency amplifiers 202, 204 which, in turn, respectively drive the high and low frequency mechanical actuators 124 and 138, respectively.

Exhaust duct 125 transports exhaust gases containing undesirable noise and heat to outlet aperture 109 for egress to the atmosphere via mixing chamber 112. Anti-noise generated in low frequency acoustic chamber 130 by mechanical actuators 138 are communicated to mixing chamber 112 by elongate port 144, which extends into the mixing chamber 112. Electrical cancellation signals provided to low-frequency mechanical actuators 138 are predominantly in the 20–200 Hz range. In similar fashion, high frequency mechanical actuators 124 receive a high frequency cancellation signal to generate high frequency anti-noise in the range of 200 Hz to approximately 500 or 600 Hz. The high frequency anti-noise is also communicated to mixing chamber 112 via aperture 109. Sensor 72 may suitably be mounted at terminus 114 of mixing chamber 112 or elsewhere outside of muffler 100 to sense the residual noise emitted from mixing chamber 112 to generate error signal (E) for the cancellation signal generator 190 to adjust the anti-noise as necessary.

Figure 8:
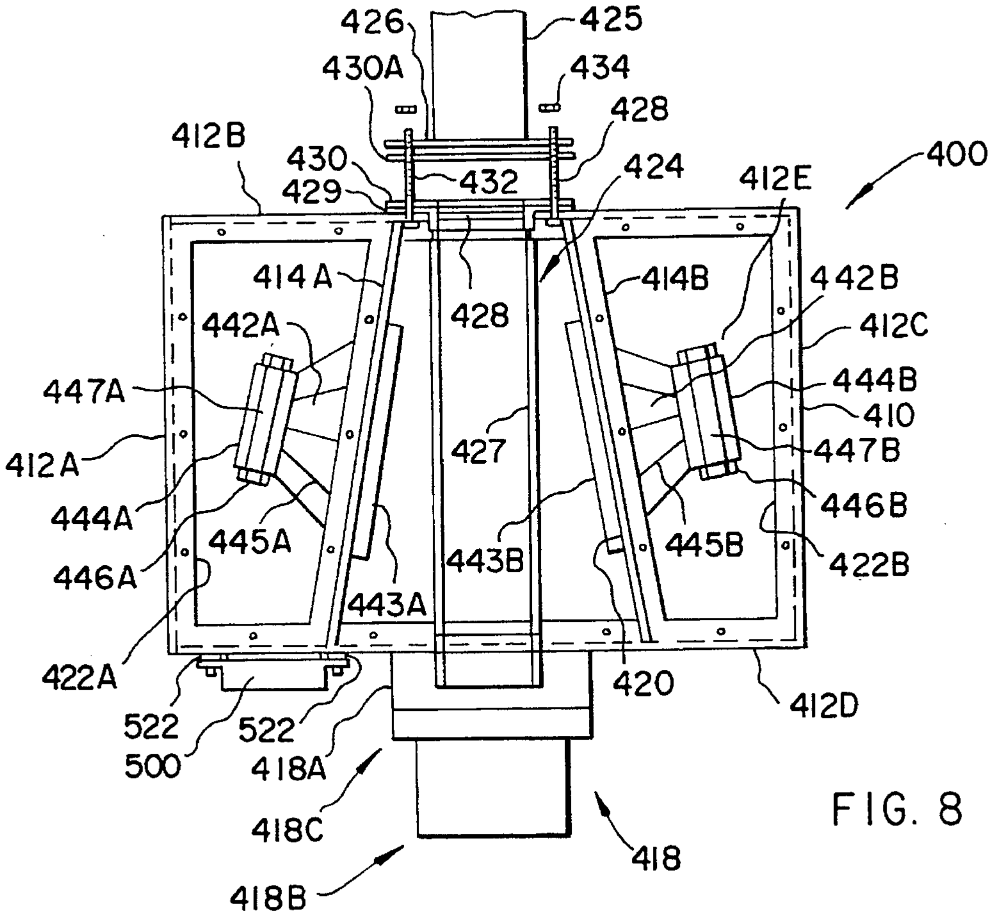
FIG. 8 is a top view of another embodiment of a muffler in accordance with various aspects of the present invention.
Figure 9:
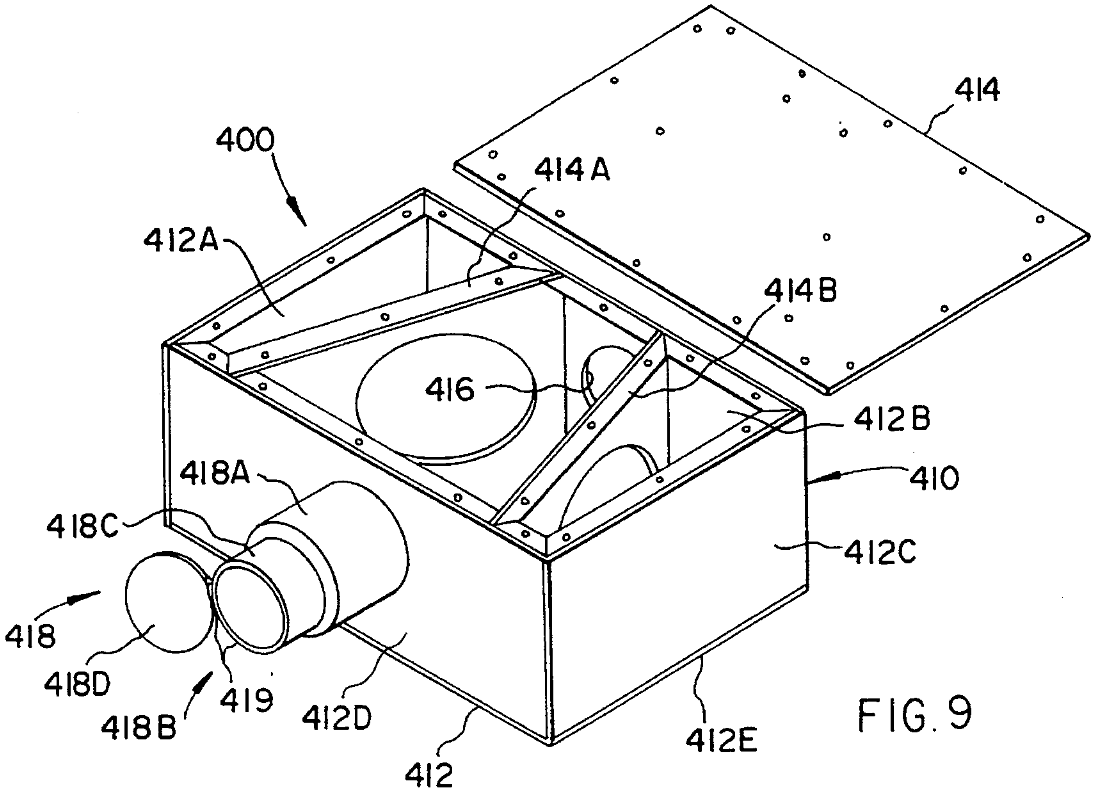
FIG. 9 is a perspective view of the embodiment of FIG. 7 in accordance with the present invention.

Referring now to FIGS. 8–9, another alternate embodiment of a muffler 400 in accordance with various aspects of the present invention comprises: a housing 410, suitably including a box-shaped (rectangular parallelepiped) portion 12 and two cylindrical sections (pipe sections) 418A and 418B; respective interior baffles 414A, 414B, disposed to divide the interior of housing 410 into a front interior volume 420 and rear volumes 422A, 422B; respective speakers 442A, 442B; an exhaust extension assembly 424; and a sensor (e.g. microphone) assembly 500.

Box shaped housing portion 412 is suitably formed of respective sidewalls 412A (side), 412B (front), 412C (side), and 412D (rear), a bottom 412E, and a top 414. Top 414 is preferably removable. Bottom 412E may include a small drain hole (not shown) for allowing moisture or unwanted fluids to exit housing 410. An aperture (inlet port) 416 is provided to receive exhaust extension assembly 424, as will be explained. In the preferred embodiment, aperture 416 comprises a 3" diameter hole formed in front wall 412B. A sensor assembly 500, further described hereinbelow, is suitably mounted on the exterior of housing 412 near cylinder assembly 418.

Cylindrical portion 418A is disposed transversely, (preferably perpendicularly), to rear wall 412D, aligned with an aperture in rear wall 412D such that the interior of cylindrical portion 418A communicates with the interior of box 412, and effectively forms part of front volume 420. Cylindrical portion 418A is preferably secured to wall 412D, suitably by welding. Cylindrical portion 418A has an inner diameter larger than the diameter of exhaust pipe assembly 14 by a predetermined amount, e.g., approximately two inches. The outer diameter of pipe section 418B is smaller than the inner diameter of section 18A and is fixed concentrically with pipe section 418A by an aluminum ring 418C. The interior of cylindrical portion 418B communicates with the interior of cylindrical portion 418A, and also forms part of front volume 420. In the embodiment of FIGS. 8–9, front volume 420 opens to the ambient atmosphere at the distal end of cylindrical portion 418B. Front volume 420 (including the interior volumes of pipe sections 18A and 18B) forms an acoustically tuned chamber.

Housing 410 is formed of a suitable rigid, heat resistant material, capable of withstanding the extreme temperatures associated with automobile exhaust systems, e.g. continuous temperatures Of about 500° F., and preferably 1000° F., and sufficiently rigid to prevent transmission of sound through walls 412A–E. In the embodiment of FIGS. 8–9, housing 410 is formed of 3/16 inch aluminum, which is jointed and welded at the corners, with cylindrical sections 18A and 18B formed of aluminum pipe. In the embodiment of the FIGS. 8–9, cylinder 18A is 3" long and 5" inside diameter; ring 418C has a 5" outside diameter and a 4" inside diameter; and second cylinder 418B has a 4" outside diameter, with an inner diameter of 3.875" and 11/4" long.

As noted above, baffles 414A and 414B divide the interior of housing 410 into front volume 420 and rear volumes 422A, 422B. In the preferred embodiment, baffles 414A and 414B are mirror images of each other, of the same height as side walls 412A, 412C, and disposed at identical predetermined angles with respect to side walls 412A, 412C. For example, in the preferred embodiment, walls 412B and 412D are disposed at a distance (i.e., the length of sidewalls 412A and 412C is) 11,250 inches, and baffles 414A, 414B are disposed 4.125" apart at front wall 412B, and 7.850" apart at rear wall 412D.

The tuning frequency of muffler 400 is determined by the ratio of front volume 420 to that of rear volumes 422A, 422B. For example, a front volume 420 of 0.23 cubic feet and symmetrical rear volumes 422A, 422B of 0.16 cubic feet establishes a tuning frequency of 177 Hz.

Rear volumes 422A, 422B are of preferably of approximately equal size, preferably within about 5%. If rear volumes 422A, 422B are independent (isolated from each other) and the sizes of rear volumes 422A, 422B are too disparate, the output of one speaker may dominate the other to the extent that only one speaker is effectively available for cancellation.

This potential problem is avoided by use of a hollow channel 428 acoustically coupling rear volumes 422A and 422B. Hollow channel 428 suitably comprises a hollow tube open at both ends, one end opening into rear volume 422A and the other into rear volume 422B. Hollow channel 428 compensates for volume and pressure inequalities between the respective rear volumes 422A, 422B, ensuring that the output of neither speaker dominates the other.

Figure 8A:
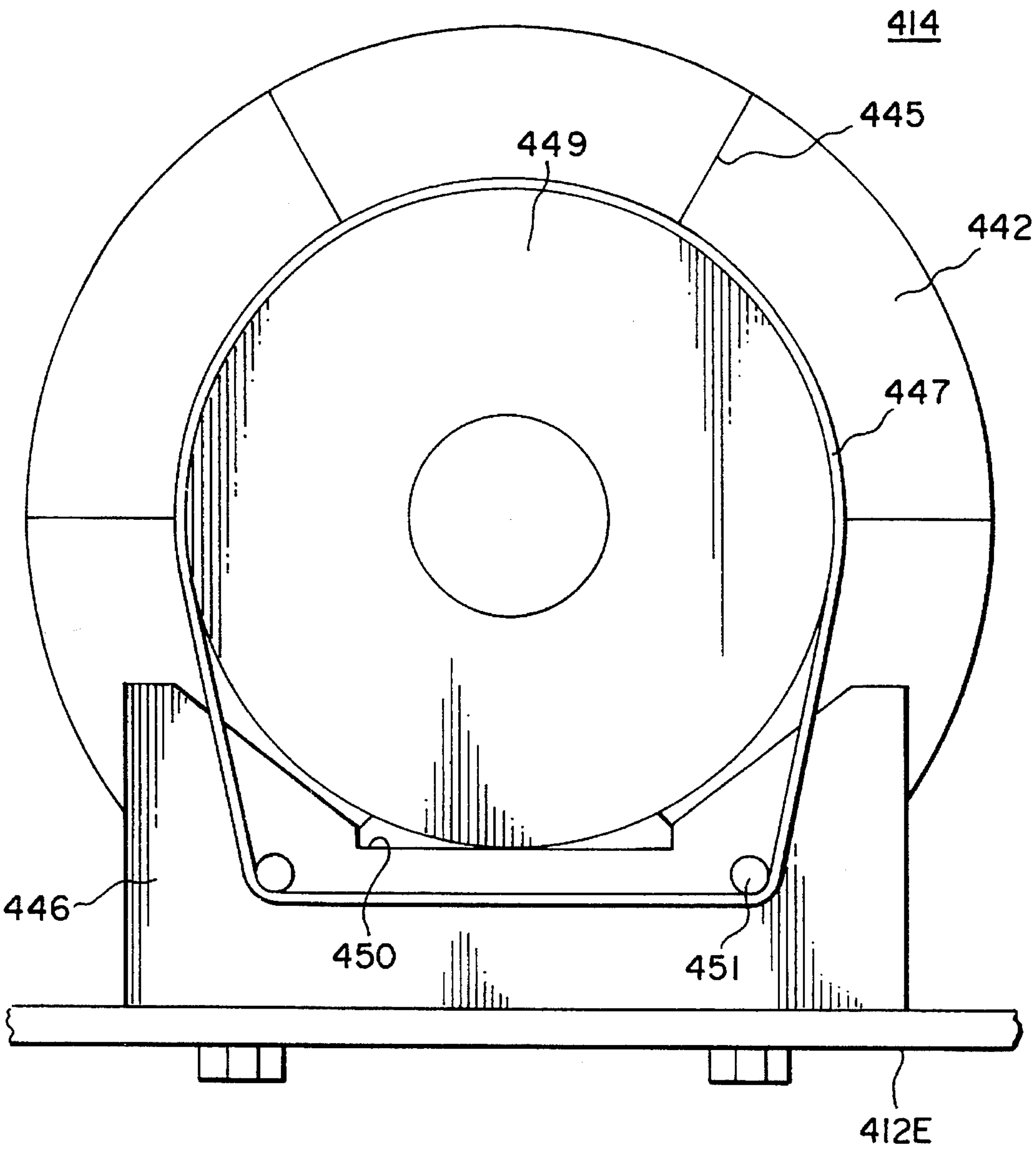
FIG. 8A is a rear view of a speaker mounted on a cradle.

Referring to FIGS. 8 and 8A, speakers 442A, 442B are mounted on baffles 414A, 414B and project sound in a direction generally perpendicular to the plane of the baffle. Baffles 414 are disposed such that speakers 442A and 442B do not directly face one another, but are mounted askance to avoid production of undesirable standing waves by the respective speakers within the enclosure.

Speakers 442A, 442B are associated with rear volumes 422A and 422B, respectively. Speakers 442A, 442B are supported by baffles 414A, 414B, respectively. The speaker cones extend through baffle apertures 415 (best seen in FIG. 9), with the periphery of the speakers' front surface 443A, 443B, on the forward volume side of baffle 414, and rear surfaces 444A, 444B extending into the rear volumes 422A, 422B, respectively. Webbing 445A, 445B, suitably comprised of thin perforated metal, is preferably provided for support.

It has been found that the constant vibration present in the environment of an operating automobile tends to result in deformation of speaker 442 or baffles 414. To avoid potential deformation of speakers 442, respective cradles 446A, 446B, formed of a suitable rigid material, are provided to support the speaker magnets 449 and prevent them from vibrating. Cradles 446A, 446B are attached to bottom 412E of housing 410 and are disposed to receive magnet 449 in an angled-walled recess 450 (walls are preferably tangential to the periphery of the magnet) to support the rear of speakers 442A, 442B. Bands 447A, 447B, are provided to secure magnets 449 to bolts 451 protruding from the sides of cradles 446A, 446B. Webbings 445A, 445B provide additional support to speakers 442A, 442B. Webbings 445A, 445B and cradles 446A, 446B limit deformation of speakers 442A, 442B caused by environmental vibration of the speakers 442A, 442B, thus preserving the integrity of speakers 442A, 442B. Cradles 446 also act as heat sinks for speakers 442, radiating heat away from speakers 442A, 442B through cradles 446A, 446B and housing bottom 412E.

A conventional exhaust pipe 425 channels exhaust gases and associated noise from the engine to exhaust extension assembly 424. Extension assembly 424 is suitably journaled through inlet port 416, and extends into front volume 420. Exhaust extension assembly 424 suitably includes a duct (pipe) 427 having a flange 430 at its end, which mates to a second flange 426 attached to exhaust pipe 425. Preferably, a gasket 430, composed of heat resistant, thermally insulative material, is interposed between flange 430 and exhaust pipe 425, and an insulating collar 428 is interposed between extension assembly 424 and inlet port 416 and wall 412B to minimize heat transfer from exhaust pipe 425 to muffler housing 410.

Flanges 426 and 430 and sidewall 412B are suitably secured together to seal exhaust pipe 425 to exhaust extension assembly 424 and to fasten exhaust extension assembly 424 to housing 410, such as with bolts 432. In the preferred embodiment, flanges 426 and 430 are 4" square with four matching bolt holes in the corner of each square flange. Gasket 430A is compressed between exhaust pipe flange 426 and exhaust assembly flange 430 to prevent leakage of exhaust gases, as well as thermally insulate housing 410 from the heat of exhaust pipe 425.

Exhaust extension duct 427 conducts exhaust gases and engine noise from exhaust pipe 425 to a predetermined position within forward volume 420. Engine noise is canceled by anti-noise generated by speakers 442. Protective barriers 604 are preferably composed of acoustically transparent but thermally insulative material, and may be disposed between duct 427 and speakers 442A, 442B to protect speakers 442A, 442B from heat propagating from exhaust extension assembly 424.

The mixing of the exhaust noise exiting from exhaust extension duct 427 and the anti-noise from speakers 442 can be effected in numerous ways. For example, in the embodiment of FIGS. 8 and 9, the exhaust noise is emitted from the end of duct 427 into tuned front chamber 420, and the mixing effected in chamber 420 with both exhaust noise and anti-noise being emitted to ambient atmosphere through the outlet of front volume 420, e.g. cylindrical portion 18B.

Specifically, extension duct 427 terminates within the interior of cylindrical section 418A at a predetermined-determined distance, e.g. approximately two-inches, from the end of section 18B. As previously noted section 18B opens into ambient atmosphere; exhaust noise, anti-noise, and exhaust gas thus all exit together to atmosphere through the outlet port of acoustically tuned front volume 420.

The length of small cylinder 418B affects a number of properties of muffler 400. Specifically, the acoustical tuning of chamber 420 is affected; the far field cancellation efficiency improves as the length of small cylinder 418B is increased. However, the temperature within housing 410 also rises in accordance with the length of cylinder 418B. As the length of small cylinder 418B increases to about 1", there is an additional 5–10 decibel reduction in the far field sound without additional speaker output. However, the temperature within housing 410 also increases about 25° F. at about 1¼" length, with a further increase of about 50°–55° F. at about a 2⅜" small cylinder 418B length. The temperature increase is due to the length of the small cylinder 418B impeding exhaust flow. Thus, the length of small cylinder 418B is selected to maximize the far field silencing efficiency of muffler 400, and to control the temperature within front volume 420 within a specific temperature tolerance range.

Small cylinder 418B may further be equipped with a cap 418D as shown in FIG. 8. Cap 418D is attached to small cylinder 418B by a hinge 419. Additional noise attenuation occurs during deceleration when cap 418D closes. Hinge 419 suitably includes a simple spring which biases cap 418D towards the shut position so that cap 418D closes only when the force of the exhaust is minimal, i.e. during deceleration. Alternately, hinge 419 may be servo-operated in response to tachometer signals indicating a slowing of the vehicle.

Figure 10A:
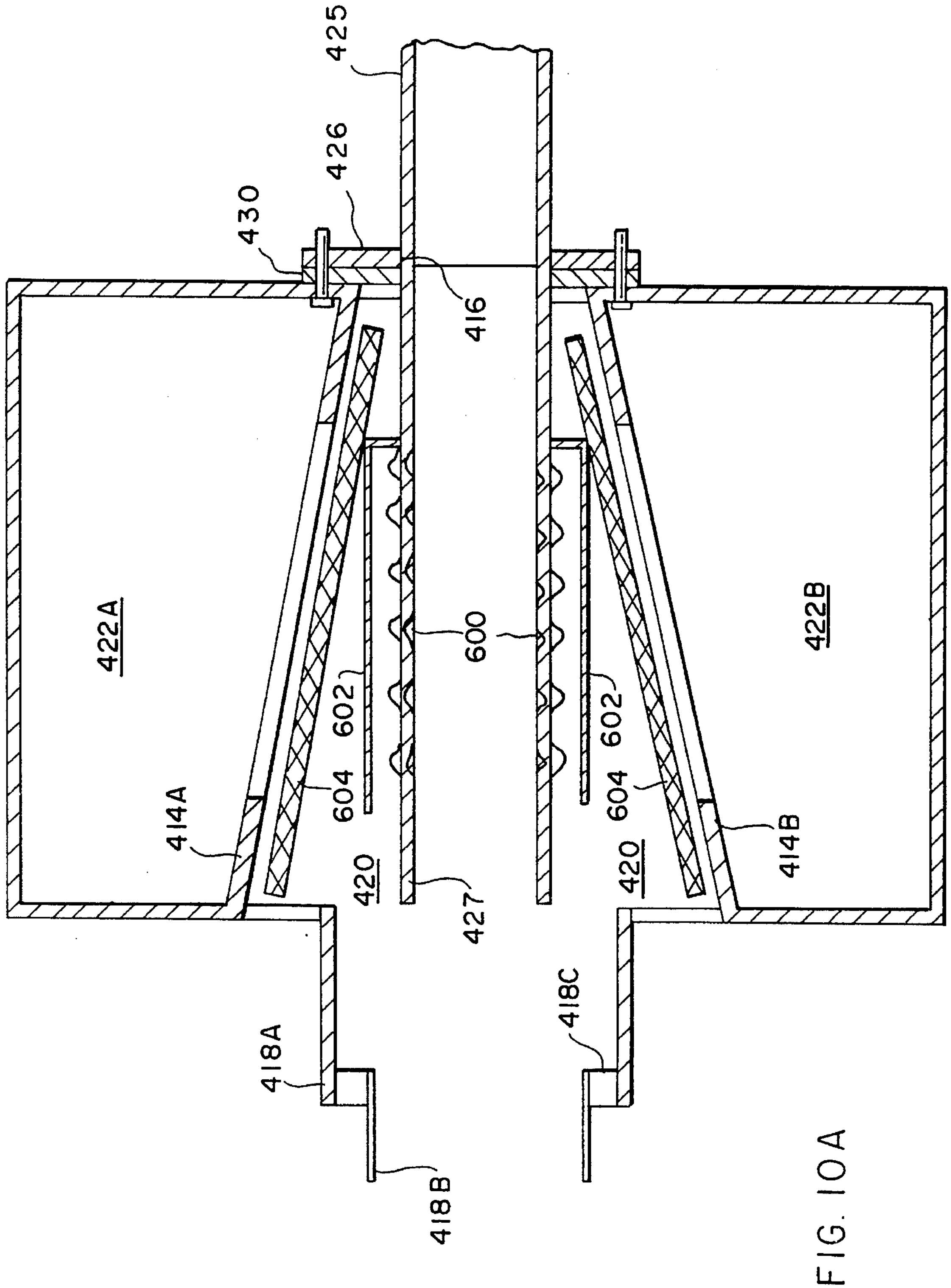
FIGS. 10A–10G are top plan cross section views of various embodiments of the present invention having different exhaust assembly duct configurations.
Figure 10B:
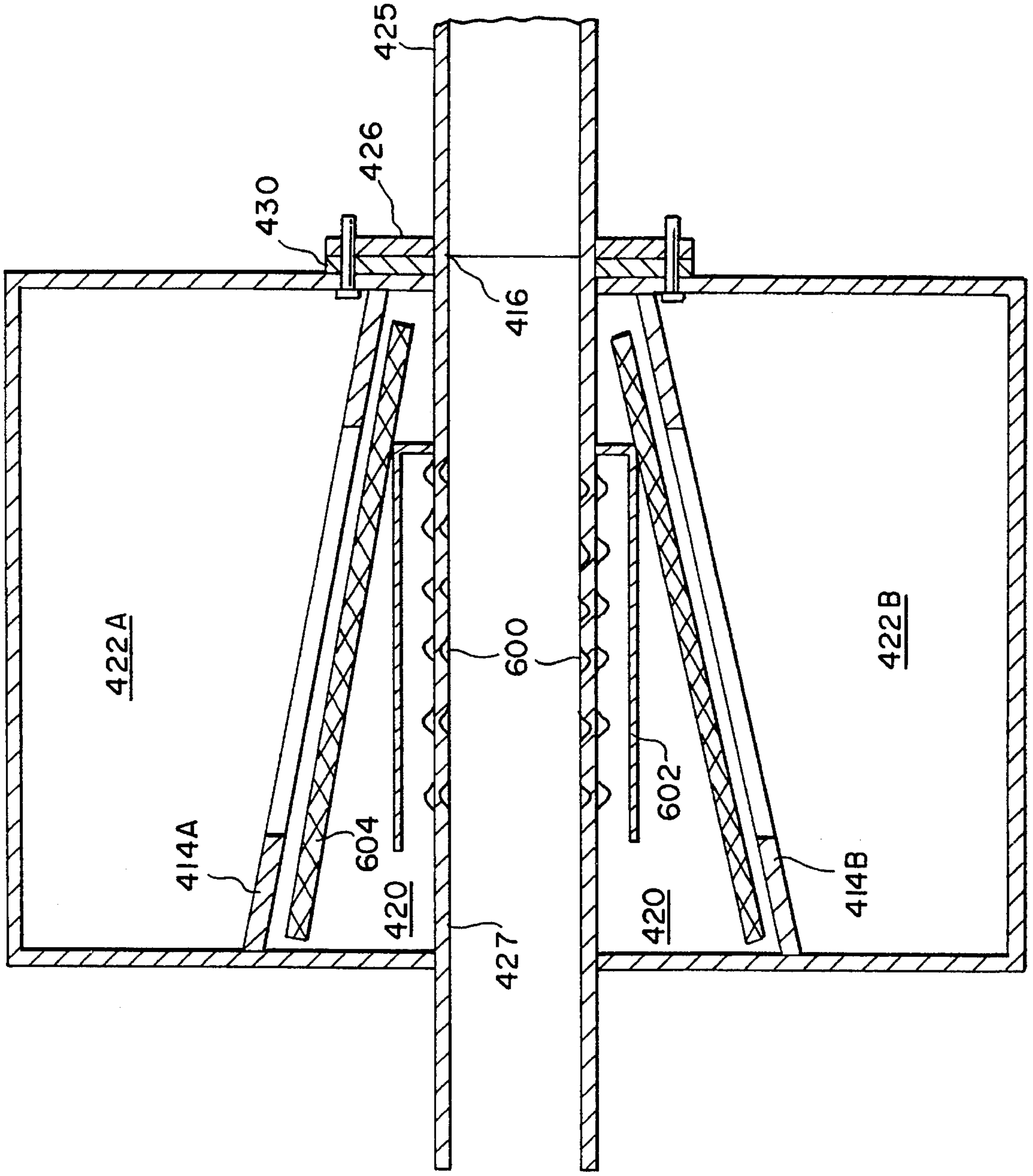

Anti-noise can also be injected into duct 427 through louvers or ports in the sidewalls of duct 427. Referring to FIGS. 10A and 10B, louvers 600 may be formed in exhaust extension duct 427 so that the interior of duct 427 communicates with front volume 420. Louvers 600 allow engine noise to effectively enter front volume 420, where engine noise mixes with anti-noise generated by speakers 442A, 442B. Exhaust gases and heat from the engine tend to pass through to the end of exhaust extension duct 427. In the embodiment of FIG. 10A, duct 427 terminates within front volume 420, and gas, exhaust noise and anti-noise pass to atmosphere though cylinder 418B. In some instances, however, cylinder 418B may be omitted, with an opening to atmosphere being provided through cylinder 418A.

If desired, a rigid cylindrical sleeve 602, having an opening defined at its rear end, is mounted concentrically with duct 427 so that a gap is formed between the exterior of duct 427 and the interior of sleeve 602. Sleeve 602 surrounds exhaust extension assembly 424 and louvers 600 to channel noise towards the rear of muffler 400, passively filter high frequency noise, and insulate speakers 442A, 442B from heat dissipated from exhaust extension assembly 424.

Further, volume 420 need not open directly to ambient atmosphere; volume 420 can instead communicate only with the interior of duct 427, with mixing effected within duct 427 and in front volume 420. Specifically, referring to FIG. 10C, cylindrical portions 418 are omitted from the muffler, rather, duct 427 is journaled through an aperture in wall 412D, suitably in cooperation with an insulating collar analogous to collar 428, and extends beyond wall 412D by a predetermined distance, preferably in the range of 3 to 6 inches. Volume 420 does not open directly to ambient atmosphere; rather it communicates with the interior of duct 427 through louvers 600. Exhaust noise, gas and anti-noise are embodied to atmosphere through the terminus of duct 427. Cancellation occurs primarily in front chamber 420 and duct 427. Similar arrangements are shown in FIGS. 10D and 10F.

Figure 10C:
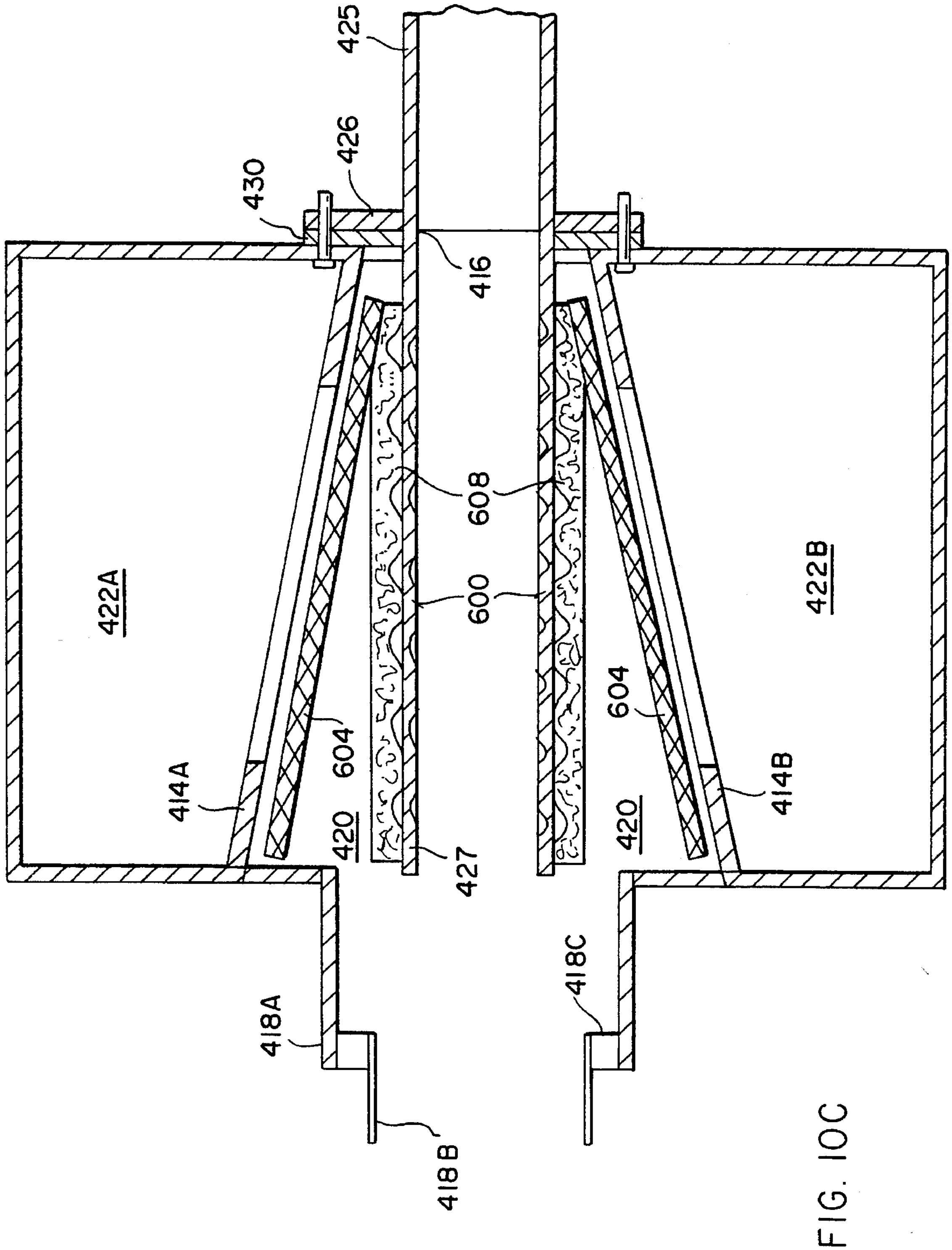
Figure 10D:
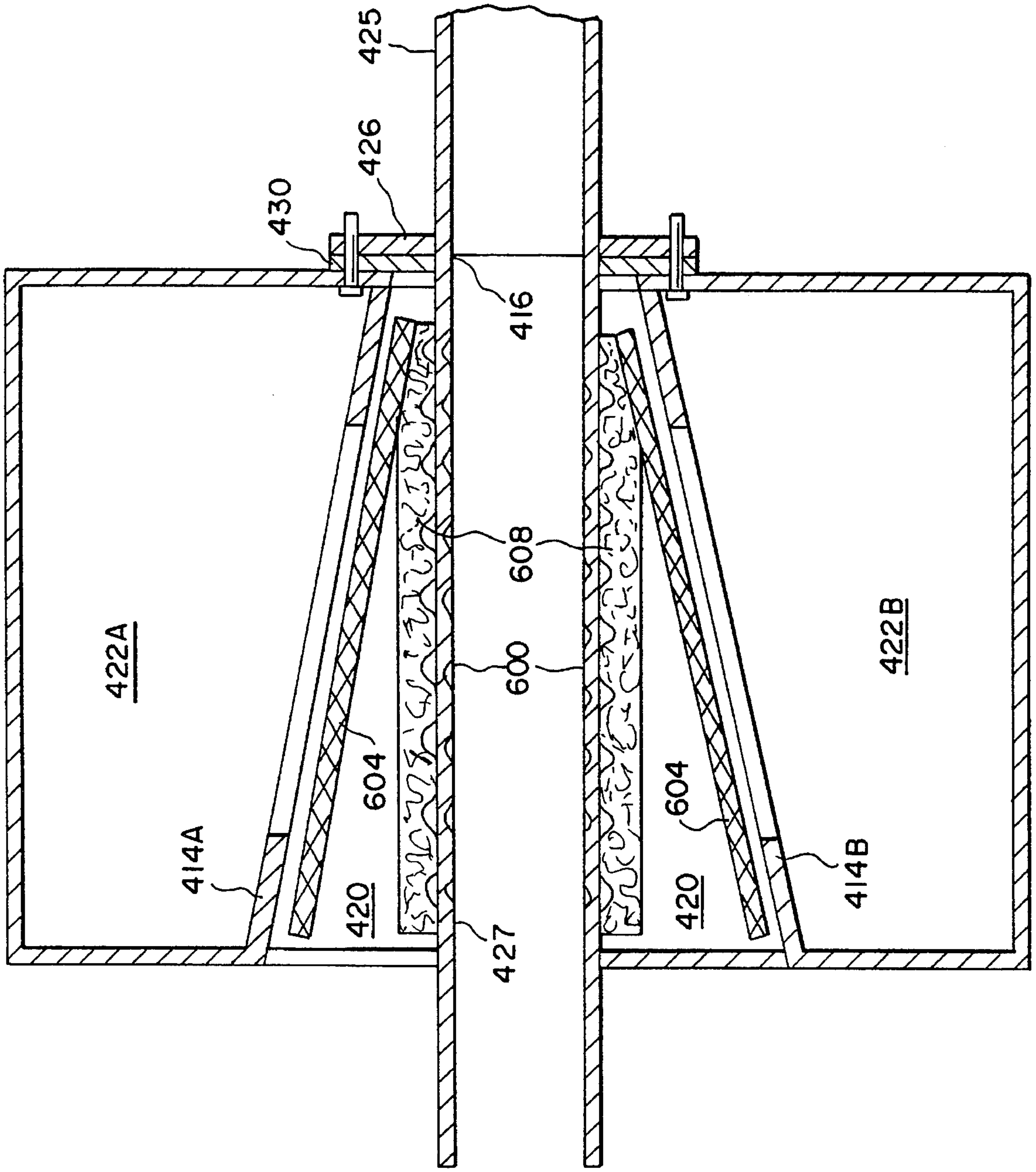

If desired, sleeve 602 may be replaced with a steel wool wrap 608 disposed around louvers 600 formed in exhaust extension duct 427 (FIGS. 10C–10D). Steel wool wrap 608 is acoustically transparent at the relevant low frequencies, but effectively dissipates heat from exhaust extension assembly 424, thus protecting speakers 442A, 442B. Steel wool wrap 608 further serves to attenuate high frequency noise emitted by the engine, enhancing the muffling qualities of muffler 400.

Figure 10E:
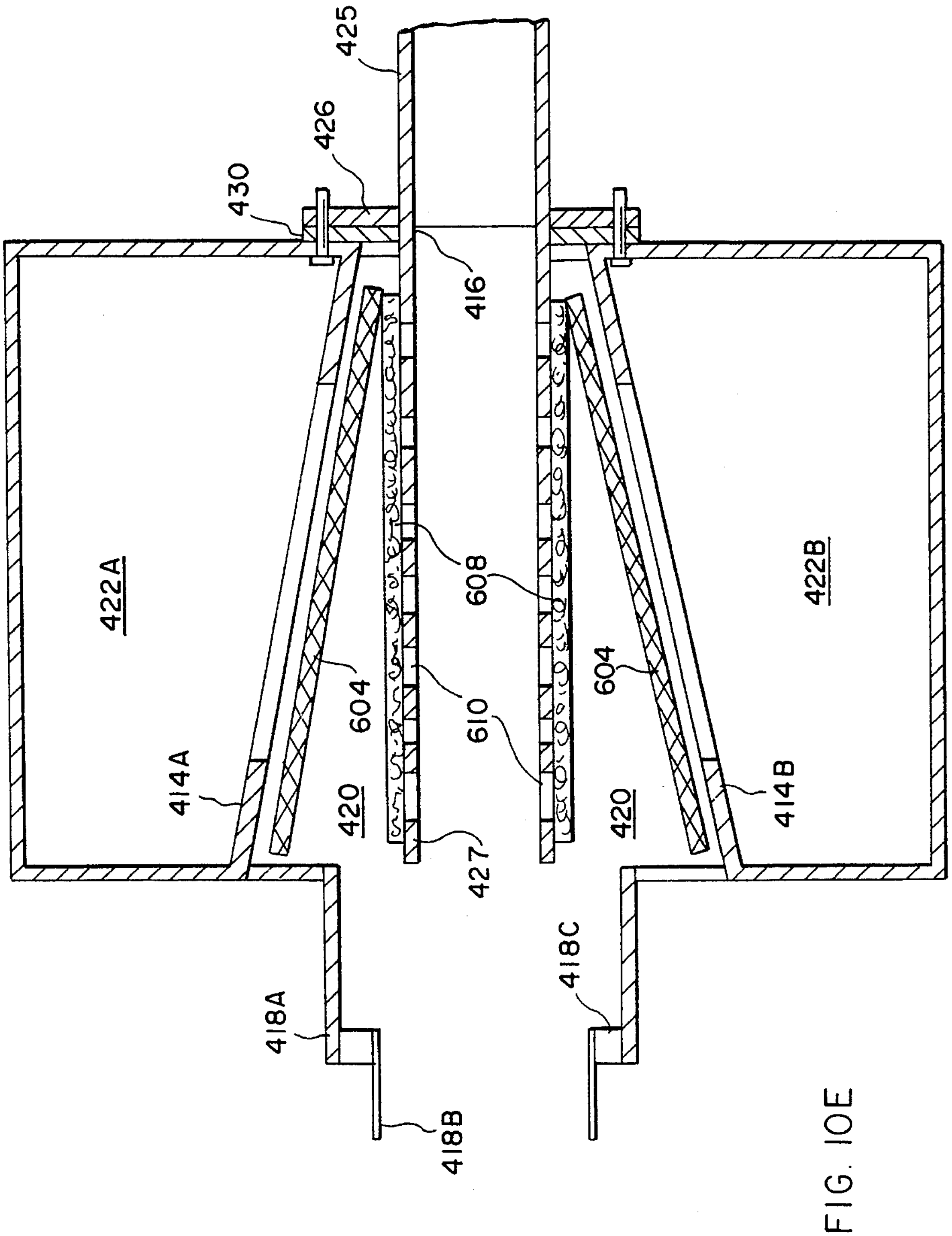
Figure 10F:
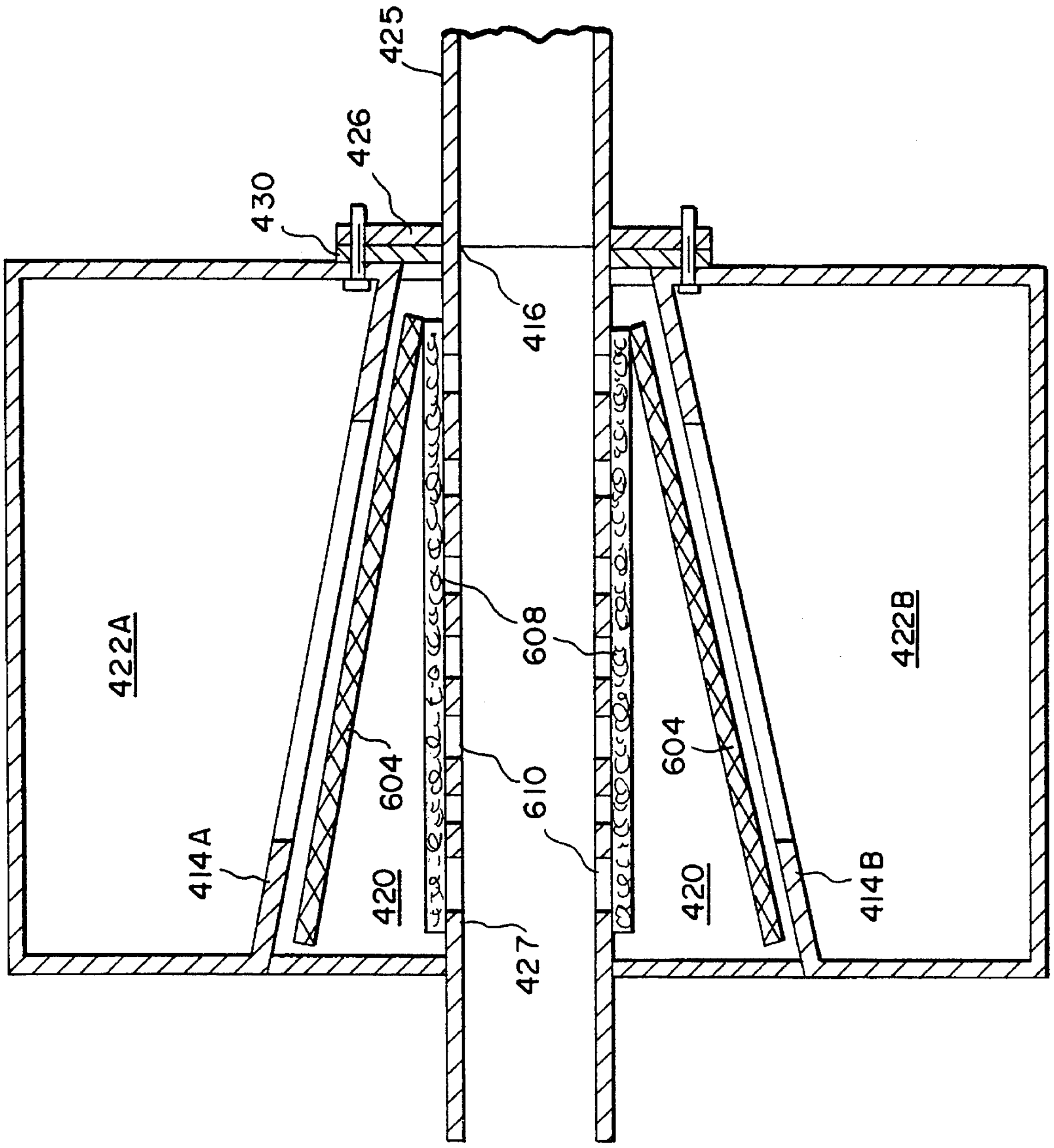

In yet other embodiments (FIG. 10E–10F), exhaust extension duct 427 may be composed of, for example, sintered ceramic or perforated (about 70%) aluminum or other metal, providing duct 427 with a series of pores or perforations 610. Like louvers 600, pores or perforations 600 allow engine noise into front volume 420, where it is subject to effective cancellation, while transporting exhaust gases and heat to the end of duct 427. Steel wool 608 provides further thermal protection for speakers 442A, 442B, as described above.

Figure 10G:
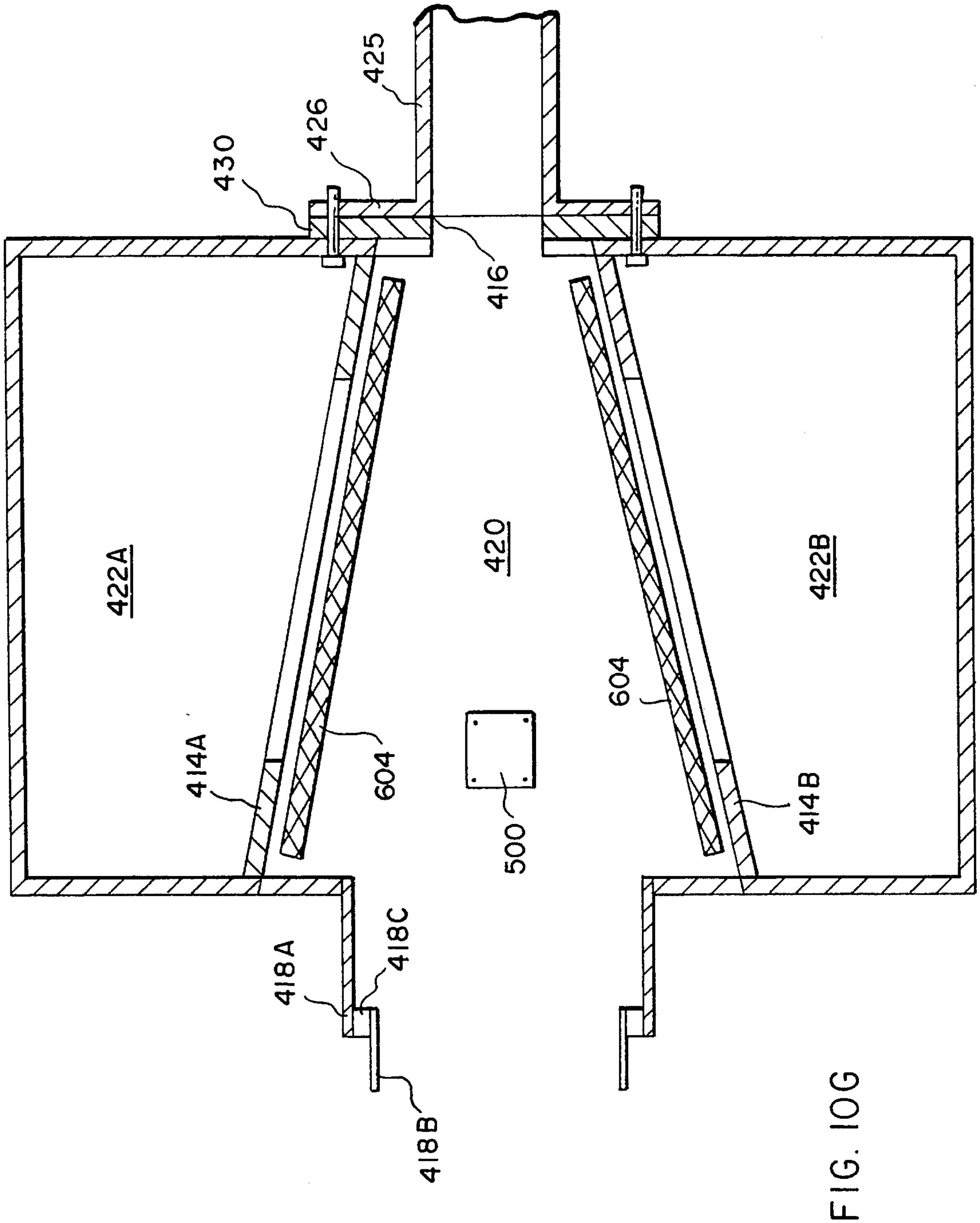

In yet another embodiment, (FIG. 10G), exhaust assembly duct 427 is omitted so that exhaust gases emitted from exhaust pipe 425 directly enter front volume 420 at inlet port 416. Protective barriers 604 protect speakers 442A, 442B from exposure to extreme temperatures. Protective barriers 604 comprise, for example, radiators 480A, 480B covering front surfaces 443A, 443B of speakers 442A, 442B to thermally insulate speakers 442A, 442B. For example, radiators 480A, 480B may suitably comprise radiators through which automobile coolant circulates or forced ambient air flows.

In such an embodiment, sensor assembly 500 may be placed within front volume 420 to measure the residual noise within muffler 400. Placing sensor assembly 500 in the proximity of speakers 442A, 442B improves the system response to changing conditions by reducing the delay between the time sound is emitted from speakers 442A, 442B and then detected by sensor assembly 500. Further, detecting residual noise prior to emission to the ambient atmosphere improves the uniformity of the far field noise because sensor assembly 500 is isolated from extraneous noise within muffler 400.

Figure 11A:
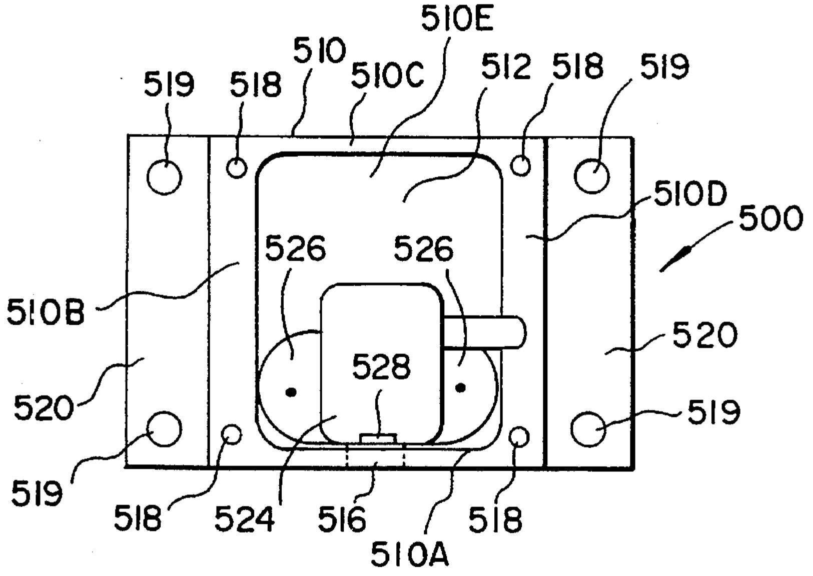
FIGS. 11A–11B are a top and side views, respectively, illustrating the construction of a microphone assembly useful in conjunction with the muffler of FIG. 7.
Figure 11B:
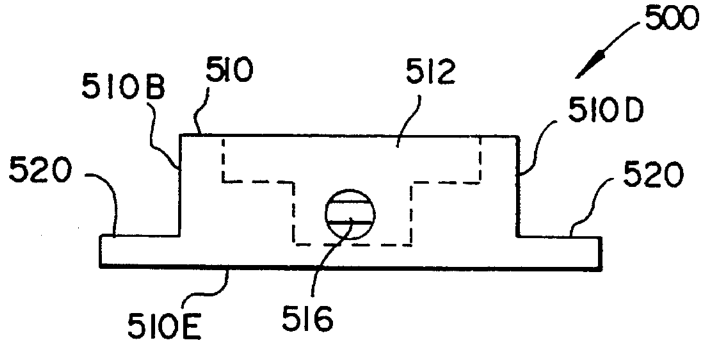

Referring now to FIGS. 11A–11B, a sensor assembly 500 in accordance with various aspects of the present invention, comprises a sensor housing 510 defining an interior cavity 512; a microphone 524 positioned within but acoustically isolated from cavity 512; and a hole 516 through sensor housing 510 providing acoustical communication between microphone 524 and the exterior of sensor housing 510. The microphone assembly provides a signal corresponding to the residual noise emitted from cylinder assembly 418 to a cancellation noise generator (not shown).

In the preferred embodiment, sensor housing 510 is rectangular and includes four side walls 510A, 510B, 510C, 510D and a bottom 510E, which define cavity 512. Sensor assembly 500 is preferably positioned on the exterior of housing 410 adjacent outlet port 418. A lid (not shown) is provided which protects cavity 512 from the elements. The lid is bolted to sensor housing 510 by four bolts which screw into threaded holes 518 formed in each corner of sensor housing 510. The entire assembly is comprised of rugged material capable of withstanding weather, road conditions, and the heat of the muffler.

Two wing portions 520 extend from the bottom beyond opposing side walls 510B, 510D. Bolts are driven through bolt holes 519 in wing portions 520 which cooperate with matching bolt holes in housing 410 to secure sensor assembly 500 to housing 410. Grommets 522 (shown in FIG. 8) are provided for each bolt to vibrationally and acoustically isolate sensor assembly 500 from housing 410.

A microphone 524 is mounted to bottom 510E by bolts positioned in bolt holes formed in a pair of microphone wing portions 526. Preferably, microphone 524 includes an input cavity 528 which abuts a hole 530 through side wall 510A of sensor housing 510. Hole 516 provides acoustical communication between microphone 524 and the exterior of sensor housing 510. Hole 516 is preferably plugged with an acoustically transparent material such as, for example, a sintered metal (i.e. aluminum) whereby environmental contaminants such as dirt and soot are excluded but sound is transmitted to microphone input cavity 528. A layer of insulation (not shown) is suitably placed on microphone 524, and a printed circuit board (not shown), having such as pre-amplifier circuitry, may be placed on top of the insulation layer. When the lid is attached, microphone 524, the insulator, and the printed circuit board are sealed within sensor housing 510.

A service access is also preferably provided through bottom 510E of sensor housing 510 to provide access for microphone wiring. Microphone input cavity 528 is sealed from cavity 512 preferably by use of acoustically opaque material such as putty. The putty acoustically seals microphone input cavity 528 from cavity 512. This prevents the resonance of cavity 512 from disrupting the exterior acoustic signal detected by microphone 524.

In an alternative embodiment, especially suitable for electronic mufflers having an exhaust pipe extending away from the main muffler housing, the residual signal may be sensed by a sensing assembly 800 (FIG. 12), which taps directly into exhaust assembly duct 125. A small hole 810 is formed through the side of exhaust duct 125, suitably approximately midway between the terminus of exhaust duct 125 and the exterior wall of muffler casing 102. An attaching member having a threaded inner surface, such as a nut 802, is attached to exhaust duct 125 over hole 810 by appropriate means, such as welding.

Sensing assembly 800 comprises an elongated member 804 having a hollow interior. Alternatively, hollow member 804 may have a bend or elbow. One end of hollow member 804 is open, and is threaded about its exterior. The threads on the open end of hollow member 804 engage the threads of nut 802, so that the open end of hollow member 804 covers hole 810 formed in the side of exhaust duct 125.

At the opposite end of hollow member 804, a sensor, e.g. a microphone 806, is mounted and sealed within hollow member 804, forming a closed end of hollow member 804. As previously described with respect to sensor assembly 702, microphone 806 is connected to a cancellation signal generator (not shown), which generates appropriate cancellation signals based at least in part upon the residual signal detected by microphone 806. Hollow member 804 is crimped, suitably at its midpoint, to isolate microphone 806 from heat and corrosive gases, but to pass residual noise to microphone 806.

Sensor assembly 800 is advantageously isolated from outside noise and extreme weather conditions, and detects a correct residual signal before the residual exhaust noise exits into the atmosphere. Hollow member 804 seals microphone 806 away from external weather conditions and isolates microphone 806 from external noises. Crimp 808 formed in hollow member 804 prevents the exposure of microphone 806 to excessive heat and corrosive gas generated by the internal combustion engine. Residual noise, on the other hand, propagates through crimp 808 to microphone 806, where it is transduced into electrical signals and provided to the cancellation signal generator. Because the residual noise is still contained within exhaust duct 125 at the time it is measured by microphone 806, an accurate measurement of the residual noise may be obtained without concern regarding extraneous noise or an unevenly distributed noise field.

While an illustrative embodiment of the invention has been described above, it is, of course, understood that various modifications will be apparent to those of ordinary skill in the art. Such modifications are within the spirit and scope of the invention, which is limited and defined only by the appended claims.

We claim:

1. A muffler for suppressing noise emitted through an engine's exhaust, comprising:

a housing, including an acoustically tuned front volume having an outlet and at least first and second rear volumes;

an exhaust duct connected to said engine's exhaust for transporting the engine exhaust, wherein said exhaust duct terminates within said front volume;

a cancellation signal generator for receiving residual signals corresponding to the engine noise and generating drive signals according to said received residual signals;

a plurality of audio transducers, each of said transducers having a front surface and a rear surface, said front surface being acoustically coupled to said front volume, said rear surface being acoustically coupled to a corresponding one of said rear volumes, said audio transducers being adapted to receive said drive signals from said cancellation signal generator and generate anti-noise according to said received drive signals; and a sensor responsive to the noise emitted by the engine for generating electrical signals corresponding to the detected noise and providing said generated electrical signals to said cancellation signal generator.

2. The muffler of claim 1, wherein apertures are formed within said exhaust duct so that the interior of said exhaust duct communicates with said front volume.

3. The muffler of claim 2, further comprising a thermal insulator disposed between said exhaust duct and said transducers.

4. The muffler of claim 3, wherein said thermal insulator is disposed directly in front of each of said transducers.

5. The muffler of claim 1, wherein said front volume further includes an outlet assembly including a duct disposed between the end of said exhaust duct and the exterior of said housing.

6. The muffler of claim 1, wherein each of said rear chambers is acoustically coupled to another rear chamber.

7. The muffler of claim 1, wherein each of said transducers includes a driver, and wherein said muffler further comprises a cradle mounted on said housing and supporting said driver.

8. The muffler of claim 1, wherein said sensor includes:

a sensor enclosure mounted on the exterior of said housing and having an aperture formed therethrough; and a microphone disposed within said enclosure so that said microphone communicates with the exterior of said enclosure through said enclosure aperture.

9. The muffler of claim 1, wherein said sensor comprises:

a hollow member having at least one aperture formed therethrough attached to the outlet of said front volume; and a microphone disposed within said hollow member.

10. A muffler for suppressing noise emitted by an engine's exhaust, comprising:

a housing, including an acoustically tuned front volume and at least first and second rear volumes, wherein said front volume is closed to the exterior of said housing;

an exhaust duct connected to said engine's exhaust for transporting the engine exhaust, wherein said exhaust duct extends through said front volume and terminates outside of said front volume;

a cancellation signal generator for receiving residual signals corresponding to the engine noise and generating drive signals according to said received residual signals;

a plurality of audio transducers, each of said transducers having a front surface and a rear surface, said front surface being acoustically coupled to said front volume, said rear surface being acoustically coupled to a corresponding one of said rear volumes, said audio transducers being adapted to receive said drive signals from said cancellation signal generator and generate anti-noise according to said received drive signals; and a microphone responsive to the noise emitted by the engine for generating electrical signals corresponding to the detected noise and providing said generated electrical signals to said cancellation signal generator.

11. The muffler of claim 10, wherein apertures are formed within said exhaust duct so that the interior of said exhaust duct communicates with said front volume.

12. The muffler of claim 10, further comprising a thermal insulator disposed between said exhaust duct and said transducers.

13. The muffler of claim 10, wherein each of said rear chambers is acoustically coupled to another rear chamber.

14. The muffler of claim 10, wherein each of said transducers includes a driver, and wherein said muffler further comprises a cradle mounted on said housing and supporting said driver.

15. The muffler of claim 10, wherein said sensor includes:

a sensor enclosure mounted on the exterior of said housing and having an aperture formed therethrough; and a microphone disposed within said enclosure so that said microphone communicates with the exterior of said enclosure through said enclosure aperture.

16. The muffler of claim 10, wherein said exhaust duct has a hole formed therethrough, and wherein said sensor comprises:

a hollow member having a closed end and an open end;

a microphone disposed within said closed end of said hollow member; and means for attaching said open end of said hollow member to said exhaust duct so that the interior of said hollow member communicates with the interior of said exhaust duct through said open end of said hollow member and said hole formed in said exhaust duct.

17. A muffler for suppressing noise emitted by an engine's exhaust, comprising: a housing, including:

an acoustically tuned front volume having an outlet;

a mixing chamber; and a plurality of acoustic chambers, wherein each of said acoustic chambers is acoustically isolated from other acoustic chambers;

an exhaust duct connect to said engine's exhaust for transporting the engine exhaust, wherein said exhaust duct extends through said front volume and terminates in said mixing chamber;

a cancellation signal generator for receiving residual signals corresponding to the engine noise and generating drive signals according to said received residual signals, wherein said cancellation signal generator includes means for separating said received residual signals into components within predetermined frequency ranges;

a plurality of audio transducers, each of said transducers having a front surface acoustically coupled to one of said acoustic chambers, each of said audio transducers being adapted to receive said drive signals within one of said predetermined frequency ranges from said cancellation signal generator and generate anti-noise according to said received drive signals, and wherein all of said transducers acoustically coupled to the same acoustic chamber receive drive signals within the same frequency range; and a microphone responsive to the noise emitted by the engine for generating electrical signals corresponding to the detected noise and providing said generated electrical signals to said cancellation signal generator.

18. The muffler of claim 17, wherein said means for separating said received residual signals into components includes a crossover circuit.

* * * * *